United States Patent
Joseph et al.

(10) Patent No.: US 9,711,365 B2
(45) Date of Patent: Jul. 18, 2017

(54) ETCH RATE ENHANCEMENT FOR A SILICON ETCH PROCESS THROUGH ETCH CHAMBER PRETREATMENT

(71) Applicants: International Business Machines Corporation, Armonk, NY (US); ZEON Corporation, Tokyo (JP)

(72) Inventors: Eric A. Joseph, White Plains, NY (US); Goh Matsuura, Hartsdale, NY (US); Masahiro Nakamura, Eastchester, NY (US); Edmund M. Sikorski, Florida, NY (US); Bang N. To, Yorktown Heights, NY (US)

(73) Assignees: INTERNATIONAL BUSINESS MACHINES CORPORATION, Armonk, NY (US); ZEON CORPORATION, Tokyo (JP)

(*) Notice: Subject to any disclaimer, the term of this patent is extended or adjusted under 35 U.S.C. 154(b) by 0 days.

(21) Appl. No.: 14/268,098

(22) Filed: May 2, 2014

(65) Prior Publication Data
US 2015/0318182 A1    Nov. 5, 2015

(51) Int. Cl.
*H01L 21/302*    (2006.01)
*H01L 21/461*    (2006.01)
(Continued)

(52) U.S. Cl.
CPC ...... *H01L 21/3065* (2013.01); *H01L 21/3081* (2013.01); *H01L 21/3086* (2013.01); *H01L 21/30655* (2013.01); *H01L 21/76898* (2013.01)

(58) Field of Classification Search
None
See application file for complete search history.

(56) References Cited

U.S. PATENT DOCUMENTS

| | | | |
|---|---|---|---|
| 5,908,320 A | 6/1999 | Chu et al. | |
| 6,051,503 A | 4/2000 | Ashraf et al. | |

(Continued)

FOREIGN PATENT DOCUMENTS

| | | |
|---|---|---|
| JP | 6-84851 | 3/1994 |
| JP | 2008-270348 | * 11/2008 |

(Continued)

OTHER PUBLICATIONS

International Search Reported dated Aug. 18, 2015 received in International Application No. PCT/IB2015/052736.

*Primary Examiner* — Stephanie Duclair
(74) *Attorney, Agent, or Firm* — Scully, Scott, Murphy & Presser, P.C.; Louis J. Percello, Esq.

(57) ABSTRACT

Pretreatment of an etch chamber for performing a silicon etch process and Bosch process can be effected by running a deposition process employing $C_5HF_7$, or by running an alternating deposition and etch process employing $C_5H_2F_6$ and $SF_6$. It has been discovered that the pretreatment of the etch chamber for the silicon etch process can enhance the etch rate of silicon by at least 50% without adverse effect on etch profile during a first each process following the pretreatment, while the etch rate enhancement factor decreases over time. By periodically performing the pretreatment in the etch chamber, the throughput of the etch chamber can be increased without adversely impacting the etch profile of the processed substrates.

19 Claims, 16 Drawing Sheets

(51) Int. Cl.
    *B44C 1/22*           (2006.01)
    *C03C 15/00*         (2006.01)
    *C03C 25/68*         (2006.01)
    *C23F 1/00*           (2006.01)
    *H01L 21/3065*     (2006.01)
    *H01L 21/308*      (2006.01)
    *H01L 21/768*      (2006.01)

(56) References Cited

U.S. PATENT DOCUMENTS

| | | |
|---|---|---|
| 6,227,211 B1 | 5/2001 | Yang et al. |
| 6,322,716 B1 * | 11/2001 | Qiao et al. .................. 216/67 |
| 6,808,647 B1 | 10/2004 | Xu et al. |
| 7,285,228 B2 | 10/2007 | Laermer et al. |
| 7,351,664 B2 | 4/2008 | Bosch et al. |
| 7,682,480 B2 | 3/2010 | Kanarik et al. |
| 2004/0084409 A1 * | 5/2004 | Deshmukh et al. ........... 216/63 |
| 2006/0073683 A1 | 4/2006 | Collins et al. |
| 2006/0180571 A1 | 8/2006 | Fujihara et al. |
| 2007/0281489 A1 * | 12/2007 | Pandhumsoporn et al. .. 438/710 |

FOREIGN PATENT DOCUMENTS

| | | |
|---|---|---|
| JP | 2008-300616 A | 12/2008 |
| JP | 2009-206444 A | 9/2009 |

\* cited by examiner

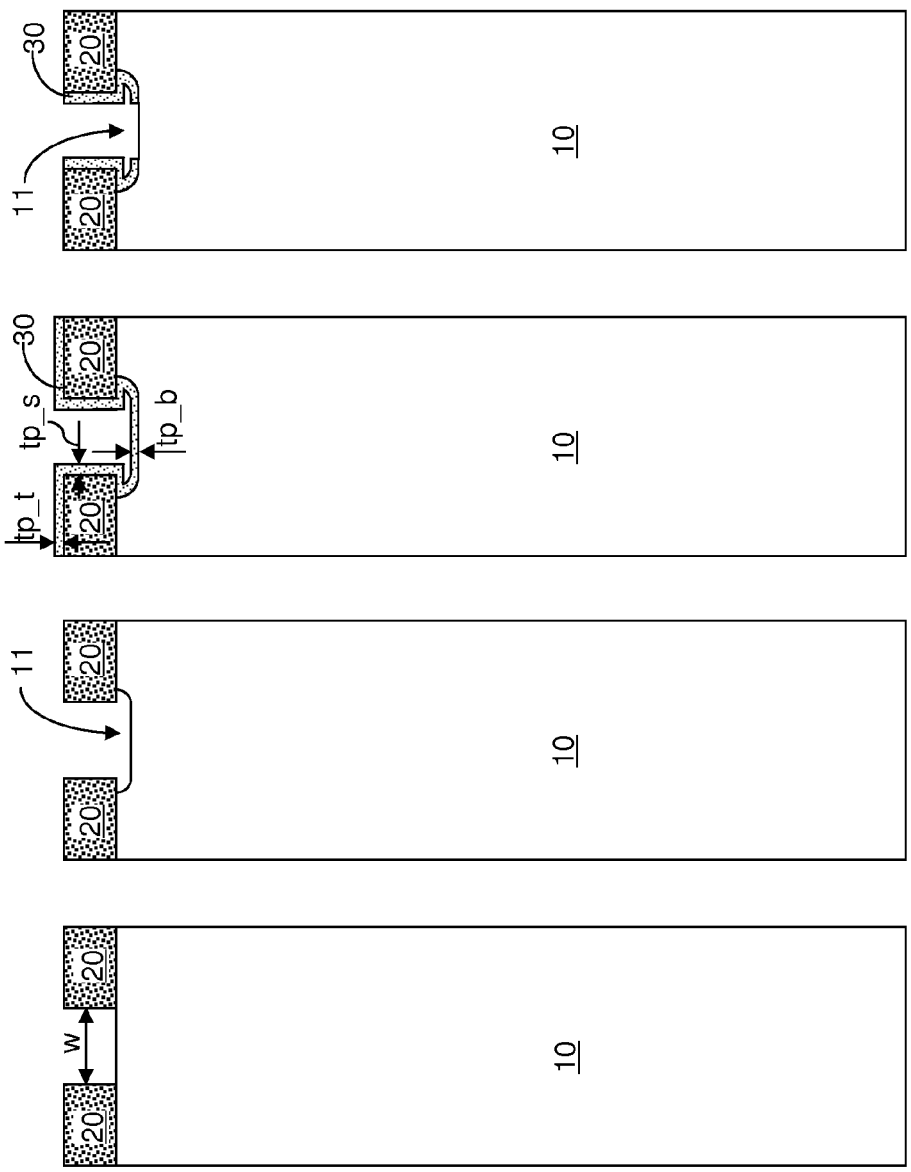

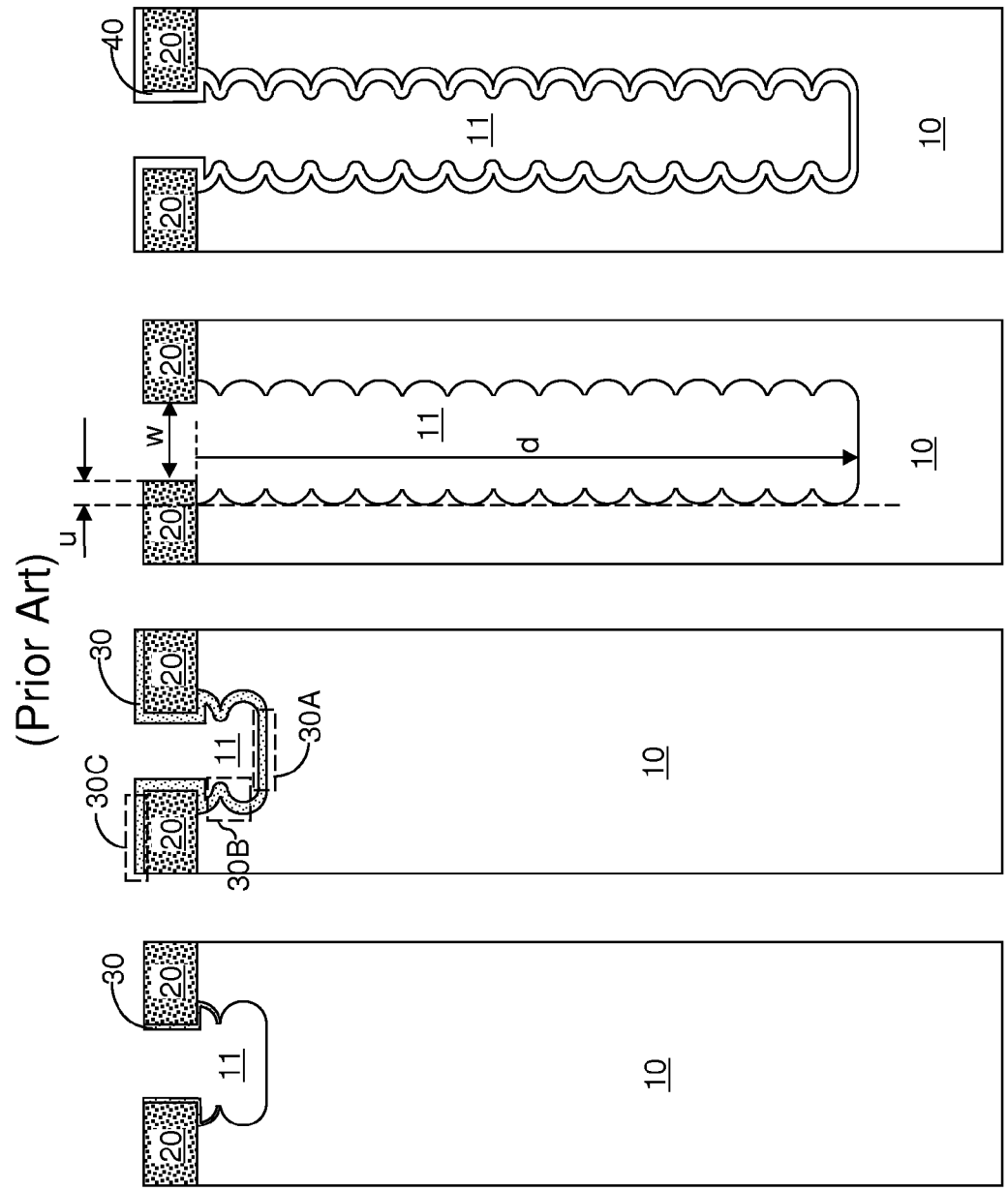

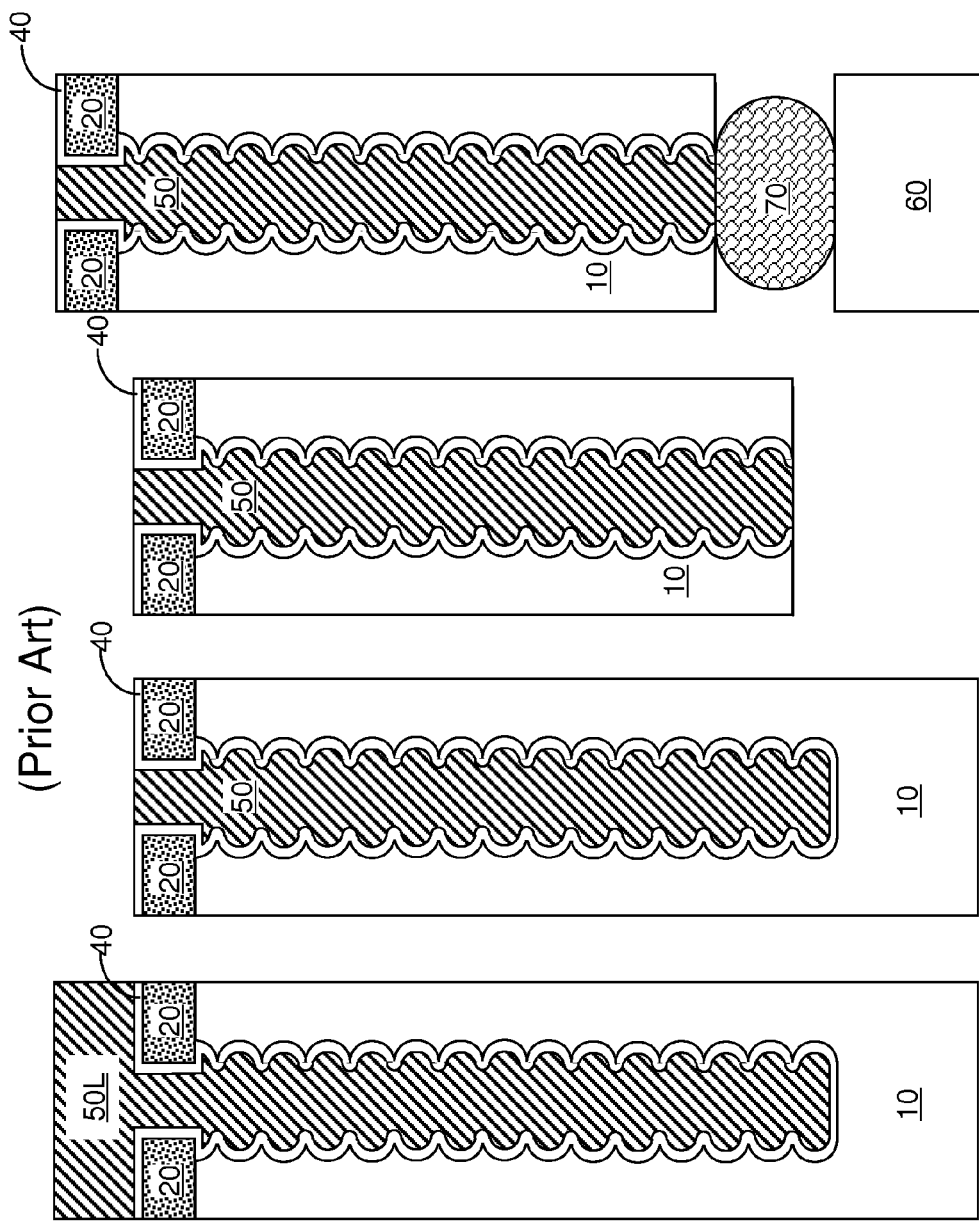

ETCH RATE ENHANCEMENT FOR A SILICON ETCH PROCESS THROUGH ETCH CHAMBER PRETREATMENT

BACKGROUND

The present disclosure relates to semiconductor processing methods, and particularly to a method of enhancing the etch rate of a silicon etch process through etch chamber pretreatment.

High aspect ratio deep silicon etch techniques are a key enabling technology for implementing through silicon via structures and three-dimensional integration of multiple semiconductor substrates. State of the art deep silicon etch utilizes a time modulated etch process, which is typically referred to as a "Bosch" process.

The Bosch process employs alternating cycles of etching employing a $SF_6$ gas and polymer deposition employing a passivation gas such as $C_4F_8$, which is a fluorocarbon gas that does not include hydrogen. The Bosch process provides a reasonable level of anisotropy required for forming high aspect ratio structures. However, the Bosch process, as known in the art, has several limitations. Attempts to increase the etch rate of the Bosch process results in roughening of sidewalls and the bottom surface of the trench due to reduction in the thickness of the passivation layer. Further, sidewall scalloping and increased undercut in the trench structure accompanies attempts to increase the etch rate of the Bosch process.

In an alternative to the Bosch process, Cryogenic process or Non switching process, known as namely Non Bosch process is proposed. The feature of Non Bosch process is that etching and passivation are carried out in a continuous process until the entire silicon feature is etched, which enables to etch silicon features without scalloped sidewall. The etching gas for non-Bosch processes is $SF_6$, and passivation gases are usually $O_2$ or HBr or fluorocarbon gas such as $C_4F_8$ or hydro fluorocarbon gas such as $CH_3F$, $CHF_3$. For example, when using $O_2$ as the passivation gas, a layer of $SiO_xF_y$, wherein x and y is a positive integer is formed on the sidewall of the silicon feature under around −100 degrees Centigrade, which is more resistant to etch by $SF_6$ than the silicon substrate.

Disadvantages of Non Bosch process are lower etch rate, temperature control issue and narrow process control margin rather than Bosch process. Attempts to increase the etch rate of the Non Bosch process results in roughening of sidewalls and the bottom surface of the trench due to reduction in the thickness of the passivation layer as well as Bosch process.

Thus, the etch rate of the Bosch or Non Bosch process as known in the art cannot be increased without deleterious effect on the etch profile of the trenches formed by the Bosch or Non Bosch process. The requirement of smooth sidewalls and bottom surfaces as well as controlled undercut in the profile of the trenches limits the etch rate of the Bosch process, and in turn, limits the throughput of etch chambers that perform the Bosch or Non Bosch process. The productivity of etch chambers performing the Bosch or Non Bosch process is thus limited by the etch rate of the Bosch process.

SUMMARY

Pretreatment of an etch chamber for performing a silicon etching employing $SF_6$ as an etchant gas can be effected by running a deposition process employing $C_5HF_7$, or by running an alternating deposition and etch process employing $C_5H_2F_6$ and $SF_6$. It has been discovered that the pretreatment of the etch chamber for the silicon etch process can enhance the etch rate by at least 50% without adverse effect on isotropic profile during a first silicon etch process following the pretreatment.

As another aspect of the present disclosure, pretreatment of an etch chamber for performing a Bosch process can be effected by running a deposition process employing $C_5HF_7$, or by running an alternating deposition and etch process employing $C_5H_2F_6$ and $SF_6$. It has been discovered that the pretreatment of the etch chamber for the Bosch process can enhance the etch rate by at least 50% without adverse effect on etch profile during a first Bosch process following the pretreatment, while the etch rate enhancement factor decreases over time. By periodically performing the pretreatment in the etch chamber, the throughput of the etch chamber can be increased without adversely impacting the etch profile of the processed substrates.

According to an aspect of the present disclosure, a method of operating an etch process apparatus is provided. A pretreatment process in an etch process apparatus is performed. The pretreatment process includes pretreating inner walls of the etch process apparatus by depositing a hydrofluorocarbon polymer material generated from a plasma of a hydrofluorocarbon gas having a composition of $C_xH_yF_z$, wherein x is an integer selected from 3, 4, 5, 6, and 7, y is a positive integer, and z is greater than the sum of x and y. A coating of the hydrofluorocarbon polymer material is formed on the inner walls of the etch process apparatus during the pretreatment process. The Silicon etch process employing $SF_6$ as an etchant gas or Bosch process can be subsequently performed on at least one substrate within the etch process apparatus. Each of the at least one substrate includes a patterned mask layer through which at least one semiconductor material portion is physically exposed.

BRIEF DESCRIPTION OF THE SEVERAL VIEWS OF THE DRAWINGS

FIG. 4A-4L are sequential schematic vertical cross-sectional views of an exemplary structure in which a through substrate via structure is formed by filling a deep trench formed by a method.

DETAILED DESCRIPTION

Figure 1:
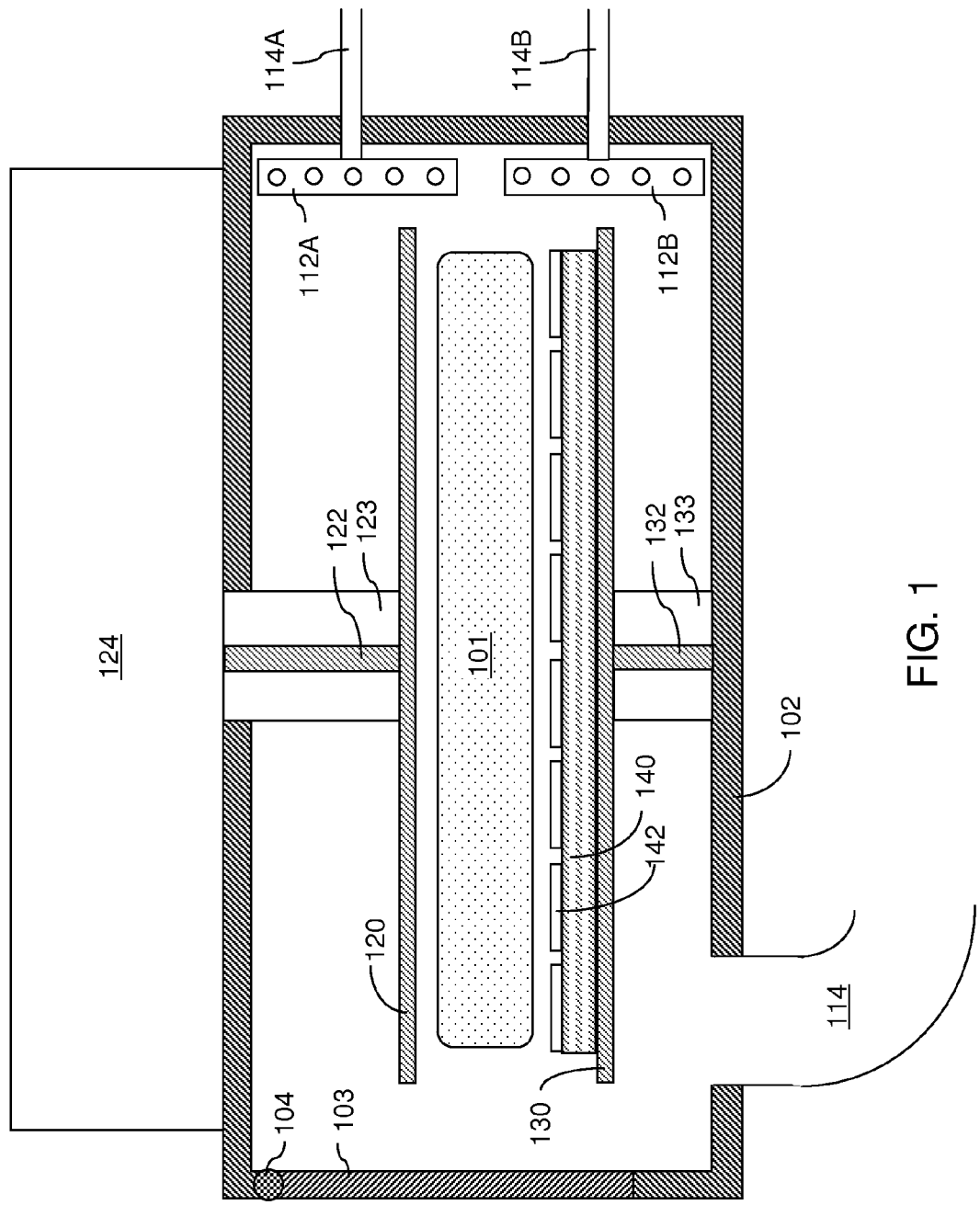
FIG. 1 is a vertical cross-sectional view of an exemplary etch process apparatus according to an embodiment of the present disclosure.

As stated above, the present disclosure relates to methods for anisotropically etching a high aspect ratio trench in a semiconductor substrate while minimizing an undercut, and structures for effecting the same, which are now described in detail with accompanying figures. Throughout the drawings, the same reference numerals or letters are used to designate like or equivalent elements. The drawings are not necessarily drawn to scale.

Referring to FIG. 1, an exemplary etch process apparatus that can be employed to practice embodiments of the present disclosure is illustrated. The exemplary etch process apparatus includes a vacuum enclosure (102, 103, 104) that defines an enclosed space capable of reaching a vacuum environment through a vacuum pumping line 114. The vacuum enclosure (102, 103, 104) can include chamber walls 102, a chamber slit door 103, and a chamber door hinge 104 about which the chamber slit door can rotate. Any other mechanism for moving the chamber slit door 103 may be employed in lieu of the chamber door hinge 104.

The exemplary etch process apparatus includes an upper electrode 120 and a lower electrode 130 that are spaced by a plasma region 101 in which plasma of a gas can be generated as needed. The lower electrode 130 can be electrically grounded to the vacuum enclosure (102, 103, 104) through an electrical connection structure 132 electrically isolated by an insulator structure 133. The upper electrode 120 can be electrically connected to a radio frequency (RF) signal generator 124 through a feedthrough wire 122 that is electrically isolated from the vacuum enclosure (102, 103, 104) by another insulator structure 123.

Gas distribution manifolds (112A, 112B) and gas feedthrough tubes (114A, 114B) can be provided in any configuration known in the art to provide process gases into the etch process apparatus. A substrate (140, 142) including a mask layer 142 located on a semiconductor layer 140 can be provided. The mask layer 142 can a dielectric material selected from doped silicon oxide, undoped silicon oxide, silicon nitride, silicon oxynitride, a dielectric metal oxide, or a combination thereof. The substrate (140, 142) can be a substrate that is subsequently processed in other processing tools to form semiconductor structures thereupon or therein, or can be a dummy substrate that is not subsequently processed to form semiconductor devices.

In one embodiment, the exemplary etch process apparatus can be any etch chamber configured to perform a silicon etch process employing $SF_6$ as etchant gas and configured to flow at least one process gas necessary for a pretreatment process of an embodiment of the present disclosure.

In another embodiment, the exemplary etch process apparatus can be any etch chamber configured to perform a Bosch process and configured to flow at least one process gas necessary for a pretreatment process of an embodiment of the present disclosure. As used herein, a Bosch process refers to an etch process in which an etchant gas and a passivation gas are cyclically flowed into a process chamber for a multiple number of cycles to etch a trench in a substrate.

The pretreatment process of embodiments of the present disclosure is performed within the exemplary etch process apparatus prior to performing at least one silicon etch process employing $SF_6$ as an etchant or Bosch process. The pretreatment process includes pretreating inner walls of the exemplary etch process apparatus by depositing a hydrofluorocarbon polymer material generated from a plasma of a hydrofluorocarbon gas. The hydrofluorocarbon gas has a composition of $C_xH_yF_z$, in which x is an integer selected from 3, 4, 5, 6, and 7, y and z are positive integer not greater than 15. For example the hydrofluorocarbon gas can include [C3] 1,1-difluoropropene, 1,2-difluoropropene, 1,3-difluoropropene, 2,3-difluoropropene, 3,3-difluoropropene, 1,1-difluorocycropropane, 1,2-difluorocycropropane, 1,1,2-trifluoropropene, 1,1,3-trifluoropropene, 1,2,3-trifluoropropene, 1,3,3-trifluoropropene, 2,3,3-trifluoropropene, 3,3,3-trifluoropropene, 1,1,2-trifluorocycropropane, 1,2,3-trifluorocycropropane, 1,1,2,3-tetrafluoropropene, 1,1,3,3-tetrafluoropropene, 1,2,3,3-tetrafluoropropene, 1,3,3,3-tetrafluoropropene, 2,3,3,3-tetrafluoropropene, 1,1,2,2-tetrafluorocycropropane, 1,1,2,3-tetrafluorocycropropane, 1,3-difluoropropyne, 3,3-difluoropropyne, 1,2-difluoropropadiene, 1,3-difluoropropadiene, 1,3,3-trifluoropropyne, 3,3,3-trifluoropropyne, 1,1,3-trifluoropropadiene, [C4] 3,3,4,4-tetrafluorocyclobutene, 1,3,3,4,4-pentafluorocyclobutene, 1,1,2,2,3,4-hexafluorocyclobutane, 1,1,2,2,3-pentafluorocyclobutane, 1,1,2,2,3,3,4-heptafluorocyclobutane, 1,1,1,4,4,4-hexafluoro-2-butene, 3,3,3-trifluoro-2-trifluoromethylpropene, 1,1,2,3,4-pentafluoro-1,3-butadiene, 1,1,2,4,4-pentafluoro-1,3-butadiene, 1,1,2,3-tetrafluoro-1,3-butadiene, 1,1,2,4-tetrafluoro-1,3-butadiene, 1,1,3,4-tetrafluoro-1,3-butadiene, 1,2,3,4-tetrafluoro-1,3-butadiene, 1,1,4,4-tetrafluoro-1,3-butadiene, 1,1,2-trifluoro-1,3-butadiene, 1,1,3-trifluoro-1,3-butadiene, 1,1,4-trifluoro-1,3-butadiene, 1,2,3-trifluoro-1,3-butadiene, 1,2,4-trifluoro-1,3-butadiene, 1,1,2,3-tetrafluoro-1-butene, 1,1,2,4-tetrafluoro-1-butene, 1,1,3,3-tetrafluoro-1-butene, 1,1,3,4-tetrafluoro-1-butene, 1,1,4,4-tetrafluoro-1-butene, 1,2,3,3-tetrafluoro-1-butene, 1,2,3,4-tetrafluoro-1-butene, 1,2,4,4-tetrafluoro-1-butene, 1,3,3,4-tetrafluoro-1-butene, 1,3,4,4-tetrafluoro-1-butene, 1,4,4,4-tetrafluoro-1-butene, 2,3,3,4-tetrafluoro-1-butene, 2,3,4,4-tetrafluoro-1-butene, 2,4,4,4-tetrafluoro-1-butene, 3,3,4,4-tetrafluoro-1-butene, 3,4,4,4-tetrafluoro-1-butene, 1,1,1,2-tetrafluoro-2-butene, 1,1,1,3-tetrafluoro-2-butene, 1,1,1,4-tetrafluoro-2-butene, 1,1,2,3-tetrafluoro-2-butene, 1,1,2,4-tetrafluoro-2-butene, 1,1,3,4-tetrafluoro-2-butene, 1,1,4,4-tetrafluoro-2-butene, 1,2,3,4-tetrafluoro-2-butene, 1,1,3,3-tetrafluoro-2-methylpropane, 1,1,3-trifluoro-2-fluoromethylpropane, 1,3,3-trifluoro-2-fluoromethylpropane, 3,3-difluoro-2-difluoromethylpropane, 1,1,2,2-tetrafluorocycrobutane, 1,1,2,3-tetrafluorocycrobutane, 1,1,3,3-tetrafluorocycrobutane, 1,2,3,4-tetrafluorocycrobutane, 1-fluoro-1-trifluoromethylcycropropane, 2-fluoro-1-trifluoromethylcycropropane, 1,1-difluoro-1-difluoromethylcycropropane, 1,2-difluoro-1-difluoromethylcycropropane, 2,2-difluoro-1-difluoromethylcycropropane, 2,3-difluoro-1-difluoromethylcycropropane, 1,2,2-trifluoro-1-fluoromethylcycropropane, 1,2,3-trifluoro-1-fluoromethylcycropropane, 2,2,3-trifluoro-1-fluoromethylcycropropane, 1,2,2,3-tetrafluoro-1-methylcycropropane, 2,2,3,3-tetrafluoro-1-methylcycropropane, [C5] 1,3,3,4,4,5,5-heptafluorocycropentene, 3,3,4,4,5,5-hexafluorocycropentene, 1,1,2,2,5,5-hexafluorocycropentane, 1,1,1,3,4,4,5,5,5-nonafluoro-2-pentene, 1,1,1,2,4,4,5,5,5-nonafluoro-2-pentene, 2,3,4,5,5,5-hexafluoro-1,3-pentadiene, 1,3,4,5,5,5-hexafluoro-1,3-pentadiene, 1,2,4,5,5,5-hexafluoro-1,3-pentadiene, 1,2,3,5,5,5-hexafluoro-1,3-pentadiene, 1,2,3,4,5,5-hexafluoro-1,3-pentadiene, 1,2,4,5,5,5-hexafluoro-1,3-pentadiene, 1,1,2,3,4,-pentafluoro-1,3-pentadiene, 3,4,5,5,5-pentafluoro-1,3-pentadiene, 1,2,3,3,4-pentafluoro-1,4-pentadiene, 1,1,2,3,3-pentafluoro-1,4-pentadiene, 1,3,3,4,4-pentafluoro-2-methylcycrobutene, 2-fluoro-1-trifluoromethylcycrobutene, 3,3,4,4-tetrafluoro-1-trifluoromethylcycrobutene, [C6] 1,3,3,4,4,5,5,6,6-nonafluorocycrohexene, 3,3,4,4,5,5,6,6-octafluorocycrohexene, 1,1,3,3-tetrafluoro-2-trifluoromethylcycropentane, 4,5,5,5-tetrafluoro-3-trifluoromethyl-1,3-pentadiene, 1,1,2,4,5,5,5-heptafluoro-3-methyl-1,3-pentadiene, 1,2-bis(trifluoromethyl)cycrobutane, 1,2-bis(trifluoromethyl)cycrobutene, 3,4-bis(trifluoromethyl)cycrobutene, 1,1,1-trifluoro-2-trifluoromethyl-3-methyl-2-butene, 1,1,1-trifluoro-3-trifluoromethyl-2-methyl-2-butene, 1,1,1,-trifluoro-3-trifluoromethyl-2-pentene, 4,4,5,5,5-pentafluoro-3-methyl-2-pentene, [7] 1,3,3,4,4,5,5,6,6,7,7-undecafluorocycroheptene, 3,3,4,4,5,5,6,6,7,7-decafluorocycroheptene, 1,3,3,4,4,5,5-heptafluoro-2-ethylcycropentene, 3,3,4,4,5,5-hexafluoro-1,2-dimethylcycropentene and 1,2-bis(fluoromethyl)cycropentene, but these are non-limiting examples of specific embodiments of the present disclosure. In one embodiment, the hydrofluorocarbon gas is 1,3,3,4,4,5,5-heptafluorocycropentene as $C_5HF_7$ and 3,3,4,4,5,5-hexafluorocycropentene as $C_5H_2F_6$. A coating of the hydrofluorocarbon polymer material is formed on the inner walls of the exemplary etch process apparatus. The thickness of the coating can be, for example, in a range from 1 nm to 10 microns.

In one embodiment, a dummy substrate can be loaded into the exemplary etch process apparatus during the pretreatment process. The dummy substrate can be subsequently removed prior to performing the at least one silicon etch process employing $SF_6$ as an etchant or Bosch process. In one embodiment, the dummy substrate can be a substrate (140, 142) illustrated in FIG. 1, which includes a mask layer 142 located on a semiconductor layer 140. As discussed above, the mask layer 142 can include a dielectric material selected from doped silicon oxide, undoped silicon oxide, silicon nitride, silicon oxynitride, a dielectric metal oxide, or a combination thereof.

Figure 2:
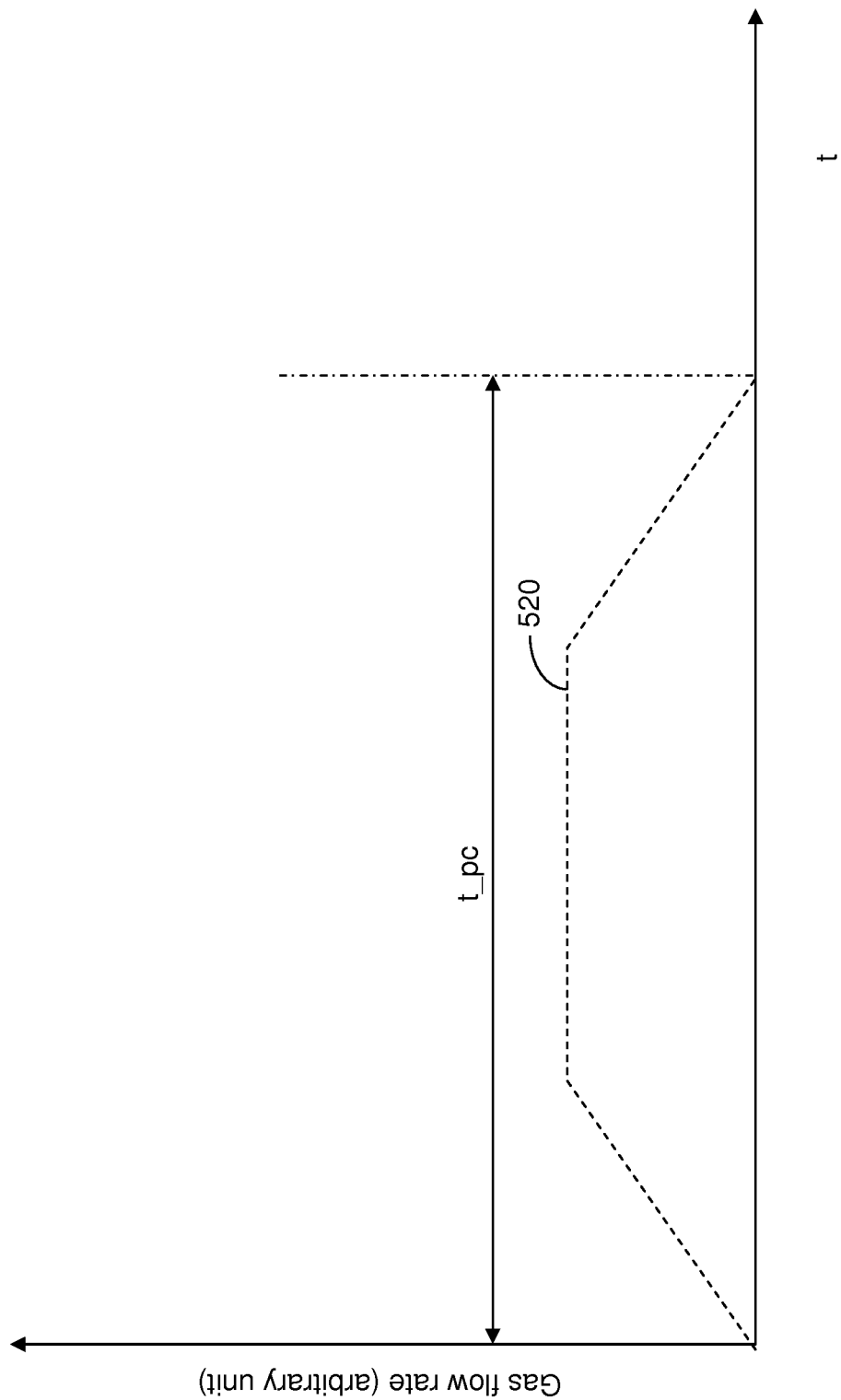
FIG. 2 is a schematic illustrating the gas flow rate for a hydrofluorocarbon gas into the exemplary etch process apparatus according to a first embodiment of the present disclosure.

Referring to FIG. 2, a gas flow schematic illustrates the gas flow rate for a hydrofluorocarbon gas that is flowed into the exemplary etch process apparatus according to a first embodiment of the present disclosure. The hydrofluorocarbon gas is flowed into the exemplary etch process apparatus at a flow rate represented by a flow rate curve 520. The pretreatment includes a deposition step, during which the flow rate of the hydrofluorocarbon gas is ramped up from zero to a target flow rate, maintained at the target flow rate, and is subsequently ramped down from the target flow rate to zero. The duration of the deposition step is herein referred to as a precoating time t_pc. A plasma of the hydrofluorocarbon gas is generated within the exemplary etch process apparatus for the duration of the flow of the hydrofluorocarbon gas, which can be in a range from 2 minutes to 60 minutes. In one embodiment, the duration of the deposition step can be in a range from 3 minutes to 30 minutes.

In one embodiment, the hydrofluorocarbon gas is $C_5HF_7$, and the pretreatment process does not employ any gas that etches a semiconductor material portion on dummy substrate. Thus, the duration of the pretreatment process can be the same as the duration of the deposition step. The target flow rate of the hydrofluorocarbon gas depends on the volume of the exemplary etch process apparatus. For an etch process apparatus configured to process a circular substrate having a diameter of 300 mm, the target flow rate of the hydrofluorocarbon gas can be in a range from 100 standard cubic centimeters per minute (sccm) to 200 sccm, although lesser and greater target flow rates can also be employed. The RF power applied to the exemplary etch process chamber to generate a plasma of the hydrofluorocarbon gas depends on the volume of the exemplary etch process apparatus. For an etch process apparatus configured to process a circular substrate having a diameter of 300 mm, the RF power can be in a range from 500 Watts to 2,000 Watts, although lesser and greater RF powers can also be employed. The pressure of the exemplary etch process chamber during the deposition employing the plasma of the hydrofluorocarbon gas can be in a range from 1 mTorr to 20 mTorr, although lesser and greater pressures can also be employed.

The properties of the spectral emission of plasma of $C_5HF_7$ are described in U.S. Patent Application Publication No. 2013/0105947A1 to Fuller et al, published on May 2, 2013 and titled "High Aspect Ratio and Reduced Undercut Trench Etch Process for a Semiconductor Substrate."

Figure 3:
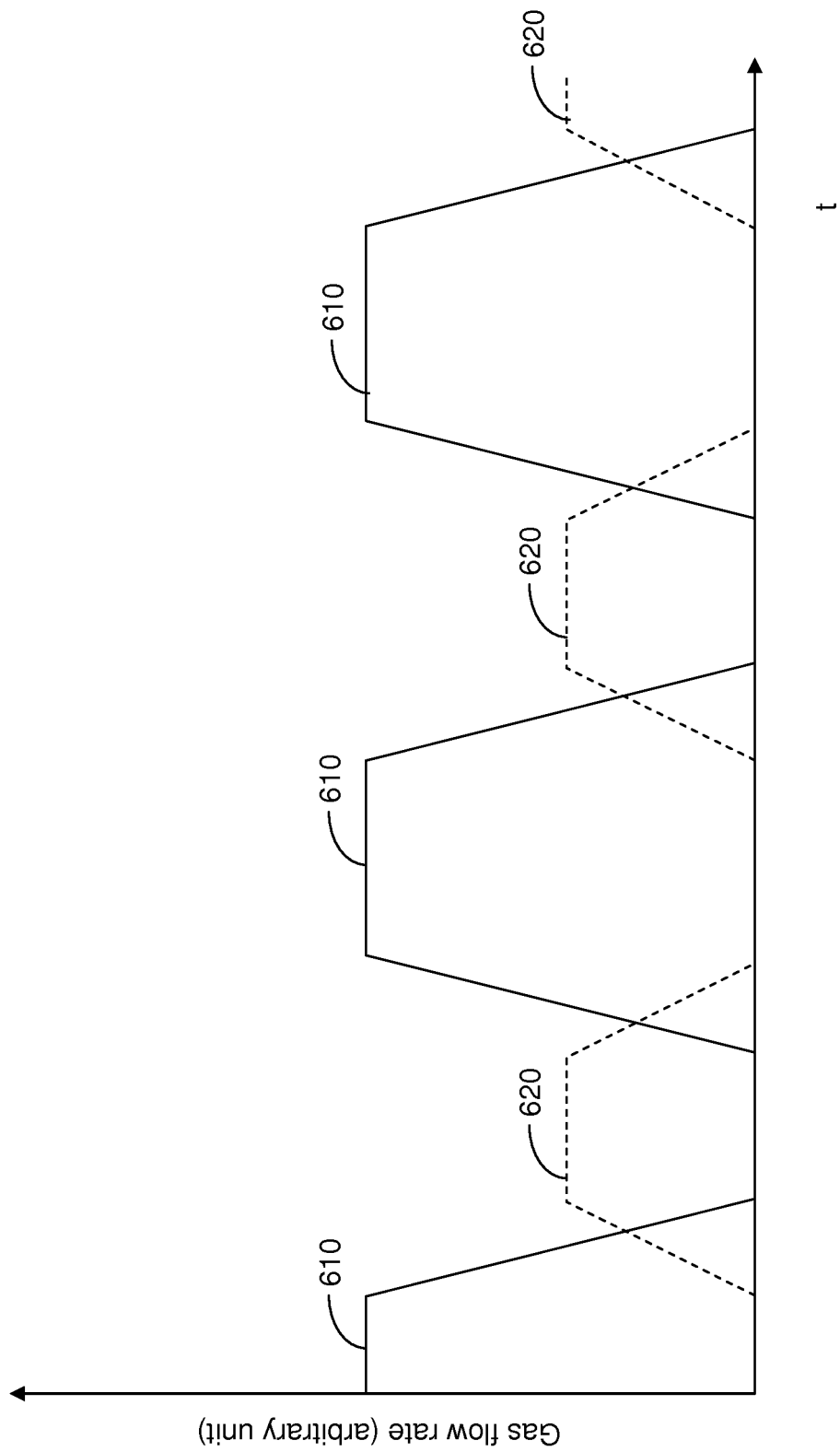
FIG. 3 is a schematic illustrating the gas flow rate for a hydrofluorocarbon gas and an etchant gas into the exemplary etch process apparatus according to a second embodiment of the present disclosure.

Referring to FIG. 3, another gas flow schematic illustrates the gas flow rates for a hydrofluorocarbon gas and an etchant gas that are flowed into the exemplary etch process apparatus according to a first embodiment of the present disclosure. The etchant gas and the hydrofluorocarbon gas can be alternately flowed into the exemplary etch process apparatus. The etchant gas can be flowed into the exemplary etch process apparatus at a flow rate represented by a first flow rate curve 610. The hydrofluorocarbon gas can be alternately flowed into the exemplary etch process apparatus at a flow rate represented by a second flow rate curve 620.

The pretreatment includes a plurality of cycles of an etch step and a deposition step. During each etch step, the flow rate of the etchant gas is ramped up from zero to a target etchant flow rate, maintained at the target etchant flow rate, and is subsequently ramped down from the target etchant flow rate to zero. During each deposition step, the flow rate of the hydrofluorocarbon gas is ramped up from zero to a target flow rate, maintained at the target flow rate, and is subsequently ramped down from the target flow rate to zero. A plasma of the etchant gas is generated within the exemplary etch process apparatus for the duration of the flow of the etchant gas. A plasma of the hydrofluorocarbon gas is generated within the exemplary etch process apparatus for the duration of the flow of the hydrofluorocarbon gas. The duration of each deposition step or each etch step can be in a range from 1 seconds to 1 minutes. The total number of cycles can be in a range from 1 to 1800. During the pretreatment, a plurality of cycles of a deposition step for depositing the hydrofluorocarbon polymer material and the etch process step can be performed.

In one embodiment, the hydrofluorocarbon gas is $C_5H_2F_6$, and the etchant gas can be $SF_6$ that etches a semiconductor material portion on dummy substrate. For an etch process apparatus configured to process a circular substrate having a diameter of 300 mm, the target flow rate of the hydrofluorocarbon gas can be in a range from 100 standard cubic centimeters per minute (sccm) to 200 sccm, although lesser and greater target flow rates can also be employed. For an etch process apparatus configured to process a circular substrate having a diameter of 300 mm, the target flow rate of the etchant gas can be in a range from 200 standard cubic centimeters per minute (sccm) to 400 sccm, although lesser and greater target flow rates can also be employed.

The RF power applied to the exemplary etch process chamber to generate a plasma of the hydrofluorocarbon gas depends on the volume of the exemplary etch process apparatus. For an etch process apparatus configured to process a circular substrate having a diameter of 300 mm, the RF power for generating a plasma of the hydrofluorocarbon gas can be in a range from 1,000 Watts to 3,000 Watts, although lesser and greater RF powers can also be employed. The RF power applied to the exemplary etch process chamber to generate a plasma of the etchant gas depends on the volume of the exemplary etch process apparatus. For an etch process apparatus configured to process a circular substrate having a diameter of 300 mm, the RF power for generating a plasma of the etchant gas can be in a range from 1,000 Watts to 3,000 Watts, although lesser and greater RF powers can also be employed.

The pressure of the exemplary etch process chamber during the deposition step employing the plasma of the hydrofluorocarbon gas can be in a range from 1 mTorr to 20 mTorr, although lesser and greater pressures can also be employed. The pressure of the exemplary etch process chamber during the etch step employing the plasma of the etchant gas can be in a range from 1 mTorr to 20 mTorr, although lesser and greater pressures can also be employed.

According to the various embodiments of the present disclosure that may, or may not, employ one or more etch processes during the pretreatment process, the pretreatment process for the inner walls of the exemplary etch process apparatus increases the etch rate of the at least one Bosch process to be subsequently performed by a positive percentage. The positive percentage can be at least 10% during the first etch process among the at least one Bosch process, i.e., the first etch process that is a Bosch process and performed after the pretreatment process.

In one embodiment, the hydrofluorocarbon polymer material deposited on the sidewalls of the exemplary etch process apparatus includes carbon at an atomic concentration in a range from 35% to 100%, and fluorine at an atomic concentration from 0% to 65%.

In one embodiment, the etch rate of the at least one silicon etch process employing $SF_6$ as an etchant gas to be subsequently performed increases by at least 50% during the first etch process among the at least one silicon etch process employing $SF_6$ as an etchant that is performed after the pretreatment process relative a comparative silicon etch process employing the same processing conditions as the first silicon etch process and performed in an etch process apparatus without any pretreatment.

In another embodiment, the etch rate of the at least one Bosch process to be subsequently performed increases by at least 50% during the first etch process among the at least one Bosch process that is performed after the pretreatment process relative a comparative Bosch process employing the same processing conditions as the first Bosch process and performed in an etch process apparatus without any pretreatment. As used herein, the same processing conditions include the same process chamber configuration, the same gas flow rates as a function of time, the same temperature conditions as a function of time, and the same pressure conditions as a function of time throughout the entirety of the processes in comparison. The effectiveness of the enhancement of the etch rate gradually decreases with the total run time of the at least one Bosch process. In one embodiment, the percentage by which the etch rate of the at least one Bosch process increases monotonically decreases with the total run time of the at least one Bosch process within the exemplary etch process apparatus.

Once the pretreatment process is performed on the exemplary etch process chamber, at least one silicon etch process employing $SF_6$ as an etchant gas and Bosch process is performed in the exemplary etch process chamber to process semiconductor substrate for manufacturing semiconductor structures, i.e., to manufacture semiconductor products contained in semiconductor substrates. The pretreatment enhances the etch rate in the at least one silicon etch process employing $SF_6$ and one Bosch process as discussed above.

FIGS. 4A-4G illustrate the sequential changes to a substrate processed in a Bosch process. Referring to FIG. 4A, an exemplary structure according to an embodiment of the present disclosure includes a semiconductor substrate 10 that includes a semiconductor material. The semiconductor material can be an elemental semiconductor material, a III-V compound semiconductor material, a II-VI compound semiconductor material, or a combination thereof. In one embodiment, the semiconductor material can be a silicon-containing material. For example, the semiconductor material of the semiconductor substrate 10 can include silicon, a silicon-germanium alloy, a silicon-carbon alloy, or a silicon-germanium-carbon alloy. In one embodiment, the semiconductor material can be silicon. The semiconductor material of the semiconductor substrate 10 can be undoped or doped with electrical dopants such as B, Ga, In, P, As, and/or Sb. Semiconductor devices (not shown) and/or metal interconnect structures (not shown) can be included in the upper portion of the semiconductor substrate. The thickness of the semiconductor substrate 10 can be from 30 microns to 2 mm, although lesser and greater thicknesses can also be employed.

A mask layer 20 is formed on the top surface of the semiconductor substrate 10, and is patterned to form openings therein. It is understood that a plurality of openings can be formed in the mask layer 20 although a single opening is illustrated in FIGS. 4A-4L. The mask layer 20 can be a hard mask layer including a dielectric material or a metallic material. Dielectric materials that can be employed for the mask layer 20 include, but are not limited to a dielectric material selected from doped silicon oxide, undoped silicon oxide, silicon nitride, silicon oxynitride, a dielectric metal oxide, and a combination thereof. Metallic materials that can be employed for the mask layer 20 include, but are not limited to, TiN, TaN, WN, WC, TiC, TaC, W, Ti, Ta, Cu, Al, and combinations or alloys thereof. The mask layer 20 can be patterned, for example, by applying a photoresist (not shown) thereupon, patterning the photoresist by lithographic exposure and development, and transferring the pattern in the photoresist into the mask layer 20 employing an etch, which can be an anisotropic etch such as a reactive ion etch or an isotropic etch such as a wet etch. Alternatively, the mask layer 20 can include an organic material such as a patterned photoresist material or a patterned layer of an optically planarizing material as known in the art. The thickness of the mask layer 20 can be from 0.2 microns to 10 microns, although lesser and greater thicknesses can also be employed.

The width w of an opening in the mask layer 20 can be from 1 micron to 50 microns, although lesser and greater widths w can also be employed. The opening can have a shape of a circle, an ellipse, or rectangle in which the lesser distance between two pairs of sides corresponds to the width w.

Referring to FIG. 4B, the exemplary structure is placed in a process chamber configured to generate a plasma therein. The process chamber can be, for example, a reactive ion etch chamber configured to generate a plasma by coupling radio frequency (RF) electromagnetic field to the a gas therein.

For example, the process chamber can be a vacuum chamber including a lower electrode on which the exemplary structure is mounted, and an upper electrode vertically spaced from the exemplary structure by a spacing. The power coupled to the plasma through the RF electromagnetic field is herein referred to as a plasma power. In addition, a constant voltage bias can be applied between the lower electrode and the upper electrode to induce the ions in the plasma to impinge on the substrate in contact with the lower electrode. The power coupled to the plasma through the constant voltage bias is herein referred to as a bias power. The oscillating electric field ionizes the gas molecules by stripping electrons from the gas molecules, thereby creating a plasma.

Once the exemplary structure is loaded into the process chamber such that the bottom surface of the semiconductor substrate 10 contacts the lower electrode, and the upper electrode is more proximal to the mask layer 20 than to the bottom surface of the semiconductor substrate 10, an etchant gas is flowed into the process chamber, for example, employing a mass flow controller. A non-limiting example of the etchant gas is sulfur hexafluoride ($SF_6$).

An etch process is performed by generating a plasma of the etchant gas. The plasma of the etchant gas can be generated in the process chamber by applying a bias voltage and an RF electromagnetic field, and thereby coupling the plasma power and the bias power to the etchant gas. The etchant gas is ionized to form a plasma containing etchant ions. The etchant ions are accelerated toward the exemplary structure to etch the semiconductor material of the semiconductor substrate 10. Because of statistical distribution of velocity of the ions in the plasma, a lateral etch accompanies a vertical etch of the semiconductor material in the semiconductor substrate 10. Thus, a trench 11 formed underneath each opening in the mask layer includes a peripheral undercut region. The undercut region of the trench 11 is the portion of the trench 11 that does not overlap the area of an overlying opening in the mask layer 20 in a top-down view in a direction perpendicular to the interface between the semiconductor substrate 10 and the mask layer 20. The undercut region is formed directly underneath portions of the mask layer 20 around the corresponding opening in the mask layer 20.

The pressure of the plasma of the etchant ions can be from 1 mTorr to 30 mTorr, although lesser and greater pressures can also be employed. The etch rate of the semiconductor material during the etch process can be from 1 micron per minute to 10 microns per minute, although lesser and greater temperatures can also be employed. The temperature of the etch process can be from −30 degrees Centigrade to 60 degrees Centigrade, although lesser and greater temperatures can also be employed. The time duration of the etch process can be from 1 second to 1 minute, although lesser and greater time durations can also be employed.

Referring to FIG. 4C, after the etch process is performed for a time period, a deposition process is performed in the same process chamber. Specifically, the etchant gas in the process chamber is pumped out of the process chamber, and a deposition gas is flowed into the process chamber, for example, employing a mass flow controller. The deposition gas can be, for example, $C_4F_8$ or any other gas known function as a polymer-generating gas in a Bosch process.

A deposition process is performed by generating a plasma of the deposition gas. The plasma of the deposition gas can be generated in the process chamber by applying a bias voltage and an RF electromagnetic field, and thereby coupling the plasma power and the bias power to the deposition gas. The deposition gas is ionized to form a plasma of fluorocarbon ions. The fluorocarbon ions are accelerated toward the exemplary structure to deposit a fluorocarbon polymer layer 30 on the top surface and sidewalls of the mask layer 20, and on the sidewalls and the bottom surface of the trench 11 within the semiconductor substrate 10. Because of statistical distribution of velocity of the ions in the plasma, the fluorocarbon polymer layer 30 is deposited as a contiguous layer that contacts the entirety of the top surface and sidewalls of the mask layer 20, and the sidewalls and the bottom surface of the trench 11 within the semiconductor substrate 10.

Various portions of the fluorocarbon polymer layer 30 can have different compositions and different thicknesses due to different anisotropy for each species of ions present in the plasma. Further, various portions of the fluorocarbon polymer layer 30 can have different thicknesses. For example, a portion of the fluorocarbon polymer layer 30 located at a bottom of the trench 11 can have a bottom polymer thickness $tp\_b$, a portion of the fluorocarbon polymer layer 30 located at a sidewall of the trench 11 and a sidewall of the mask layer 20 can have a sidewall polymer thickness $tp\_s$, and a portion of the fluorocarbon polymer layer 30 located at a top surface of the mask layer 20 can have a top polymer thickness $tp\_t$.

The pressure of the plasma can be from 1 mTorr to 30 mTorr, although lesser and greater pressures can also be employed. The deposition rate of the fluorocarbon polymer material of the fluorocarbon polymer layer 30 at various locations can be from 50 nm per minute to 500 nm per minute, although lesser and greater deposition rates can also be employed. The temperature of the deposition process can be from −30 degrees Centigrade to 60 degrees Centigrade, although lesser and greater temperatures can also be employed. The time duration of the etch process can be from 0.5 second to 30 seconds, although lesser and greater time durations can also be employed.

Referring to FIG. 4D, the etch process of FIG. 4B is performed again. The parameters for generating the plasma of the etchant ions are selected such that the etchant ions impinge on the exemplary structure are aligned predominantly along a surface normal of the interface between the semiconductor substrate 10 and the mask layer 20. The fluorocarbon polymer layer 30 is etched anisotropically such that horizontal portions of the fluorocarbon polymer layer 30 located at a bottom surface of the trench 11 and on the top surface of the mask layer 20 are etched, while portions of the fluorocarbon polymer layer 30 located on the sidewalls of the mask layer 20 and the sidewalls of the trench 11 are not removed. The species of the etchant gas and the other parameters for generating the plasma of the etchant ions can be the same as in the etch process of FIG. 4B. In one embodiment, etch process employs a plasma of a fluorine-containing etchant such as $SF_6$, and substitutes a fraction of hydrogen atoms in the fluorocarbon polymer material in the fluorocarbon polymer layer 30 with fluorine atoms prior to removing a fluorine-enhanced fluorocarbon material.

Referring to FIG. 4E, the time duration of the etch process that is initiated at the step of FIG. 4D is selected such that the etch process continues after a bottom portion of the fluorocarbon polymer layer 30 is removed and a semiconductor surface is physically exposed at the bottom of the trench 30. The etchant plasma commences etching of the semiconductor material of the semiconductor substrate 10 such that a vertical etch and a lateral etch of the semiconductor material occur simultaneously, while a remaining portion of the fluorocarbon polymer layer 30 at the sidewalls of the trench 11 protect the semiconductor material around the remaining portion of the fluorocarbon polymer layer 30. The trench 11 is extended downward to add a newly added cavity volume. The lateral extent of the newly added cavity volume modulates vertically such that the lateral extent increases gradually and then gradually decreases as a function of depth from the level of the bottom surface of the trench 11 at the end of the processing step of FIG. 4D. The time duration of this etch process can be selected such that the fluorocarbon polymer layer 30 is completely removed, or only minimally present, at the end of this etch process.

Referring to FIG. 4F, once the etch process of FIGS. 4D and 4E is completed, the deposition process of FIG. 4C can be repeated to deposit the same type of a fluorocarbon polymer material, and to form another fluorocarbon polymer layer 30. The process parameters of this deposition step can be substantially the same as the process parameters of the step of FIG. 4C.

In general, a sequence of the etch process described above and the deposition process described above is repeated on the stack of the semiconductor substrate 10 and the mask layer 20 including openings. Each etch process removes a semiconductor material at a bottom surface of the trench 11 underlying an opening, and the deposition process deposits a fluorocarbon polymer layer 30 on the bottom surface and sidewalls of the trench 11 as well as the top surface and the sidewalls of the mask layer 20. The fluorocarbon polymer material of the fluorocarbon polymer layer 30 is generated from a plasma containing ions of the fluorocarbon gas.

At the end of each deposition step, a fluorocarbon polymer layer 30 is contiguously deposited on the top surface and sidewalls of the mask layer 20 and on the sidewalls and the bottom surface of the trench 11 within the semiconductor substrate 10. The fluorocarbon polymer layer 30 includes a first fluorocarbon polymer portion 30A deposited on the bottom surface of the trench 11 and having a first composition and a first thickness, a second fluorocarbon polymer portion 30B deposited on the sidewalls of the trench 11 and the sidewalls of the mask layer 20, and a third fluorocarbon polymer portion 30C deposited on the top surface of the mask layer 20 and having a third composition and a third thickness.

At the end of each deposition step, the exemplary structure is a semiconductor structure including a stack of the semiconductor substrate 10 and the mask layer 20 having an opening therein, the trench 11 that is located within the semiconductor substrate 10 and underlies the opening and has an vertically modulated width, and a fluorocarbon polymer layer 30 that extends from the top surface and sidewalls of the mask layer 20, through sidewalls of the trench 11, and to the bottom surface of the trench 11.

The repeated performance of the sequence of the etch process and the deposition process forms modulations in the lateral dimension, i.e., the width, within the trench 11 as a function of depth from the interface between the top surface of the semiconductor substrate 11 and the mask layer 20. The total number of repetitions of the sequence of the etch process and the deposition process can be from 2 to 1,000, and typically from 30 to 200, although a greater number of repetitions can also be employed. Each repetition of the sequence of the etch process and the deposition extends the trench 11 downward to add a newly added cavity volume. The lateral extent of the newly added cavity volume modulates vertically such that the lateral extent increases gradually and then gradually decreases as a function of depth from the level of the bottom surface of the trench 11 at the end of the processing step of FIG. 4D. The time duration of this etch process can be selected such that the fluorocarbon polymer layer 30 is completely removed, or only minimally present, at the end of each etch process.

Referring to FIG. 4G, the last the sequence of the etch process and the deposition process can be followed by another etch process that extends the trench 11 downward for the last time. The trench 11 as provided after the last etch process has a vertically modulating width, which is herein referred to as "scalloping." One cycle of modulation of the width of the trench 11 corresponds to an etch process within a sequence. The total number of cycles in the modulation of the width of the trench 11 is the same as the sum of the number of repetitions of the sequence of the etch process and the number 1, which corresponds to the last etch process that is not followed by a deposition process.

The depth d of the trench can be from 20 microns to 200 microns, although lesser and greater depths can also be employed. The lateral distance between the outermost lateral extent of a sidewall of the trench 11 and a sidewall of the mask layer 20 that is most proximal to that sidewall of the trench 11 in a vertical cross-sectional view in a widthwise direction of the trench 11 is herein referred to as an "undercut dimension" u of the trench 11. As used herein, a widthwise direction of the trench 11 is a direction along which the lateral separation distance between two opposing sidewalls is minimized. If the shape of the opening in the mask layer 20 is circular, any vertical passing through a vertical center axis of the trench 11 is a widthwise direction. If the shape of the opening in the mask layer 20 is rectangular, the widthwise direction is the direction of a shorter pair of sides of the rectangle that defines a periphery of the opening in a top-down view.

In a non-limiting illustrative example, the undercut dimension u of the trench 11 can be on the order of 300 nm if the width w of the opening is from 3 micron to 5 micron and the depth d of the trench is on the order of 50 microns, and gradually increases to be on the order of 600 nm if the width w of the opening is on the order of 50 microns and the depth d of the trench 11 is on the order of 100 microns. The lateral modulation of a sidewall of the trench 11 as seen in a vertical cross-sectional view in the widthwise direction can be from 5% to 30% of the undercut dimension.

Each of the at least one Bosch process employs a plasma of a fluorine-containing etchant. Within the exemplary etch process chamber, the at least one Bosch process substitutes a fraction of hydrogen atoms in the hydrofluorocarbon polymer material with fluorine atoms, thereby gradually decreasing the etch rate in the at least one Bosch process with the total process time of the at least one Bosch process. To maintain a high average etch rate, a pretreatment process and at least one Bosch process may be performed repeated. In other words, a sequence of processes performed within the exemplary etch process apparatus can include a first pretreatment process, a first set of at least one Bosch process, a second pretreatment, a second set of at least one Bosch process, and so on.

The at least one Bosch process performed on the at least one substrate can be a plurality of Bosch processes sequentially performed on a plurality of substrates. A new substrate can be loaded into the exemplary etch process apparatus prior to commencing each Bosch process, and can be unloaded from the exemplary etch process apparatus after finishing each Bosch process.

In one embodiment, the Bosch process can employ $SF_6$ as the etchant. In one embodiment, the at least one Bosch process can employ $C_4F_8$ as a passivation gas.

Each Bosch process is performed on a "production substrate," which is a substrate including a semiconductor material in which semiconductor devices have been formed or are subsequently formed. Each substrate that is loaded into the exemplary etch process chamber includes a mask layer 142 located on a semiconductor layer 140 as illustrated in FIG. 1. The mask layer can include a dielectric material selected from doped silicon oxide, undoped silicon oxide, silicon nitride, silicon oxynitride, a dielectric metal oxide, or a combination thereof. The semiconductor layer 140 can include silicon or a semiconductor alloy including silicon.

Once the Bosch process is completed, the substrate can be removed from the exemplary etch process apparatus, and additional processing steps can be subsequently performed. Referring to FIG. 4H, the surfaces of the trench 11 can be cleaned, for example, by a wet clean. Optionally, the mask layer 20 may, or may not, be removed. A dielectric liner 40 is deposited on the sidewalls of the trench 11 by a conformal deposition process such as chemical vapor deposition or atomic layer deposition. The dielectric liner 40 includes a dielectric material such as silicon oxide, silicon nitride, silicon oxynitride, a dielectric metal oxide, or a combination thereof. The thickness of the dielectric liner 40 can be from 50 nm to 1,000 nm, although lesser and greater thicknesses can also be employed.

Referring to FIG. 4I, a conductive material layer 50L can be deposited to fill the trench 11. The conductive material layer 50L can be deposited, for example, by chemical vapor deposition, electroplating, electroless plating, or a combination thereof. The conductive material layer 50L can include a metallic material such as Cu, Al, W, TaN, TiN, WN, or a combination thereof.

Referring to FIG. 4J, the conductive material layer 50L can be planarized to form a through substrate via structure 50, for example, by chemical mechanical planarization. The dielectric liner 40 and/or the mask layer 20 can be employed as a stopping layer for the planarization process.

Referring to FIG. 4K, a bottom portion of the semiconductor substrate 10 can be removed, for example, by grinding or chemical mechanical planarization to physically expose a bottom portion of the through substrate via structure 50. A surface of the dielectric liner 40 is also physically exposed around the bottom surface of the through substrate via structure 50.

Referring to FIG. 4L, the semiconductor substrate 10 can be bonded to a substrate 60, for example, through a C4 ball 70. The substrate 60 can be another semiconductor substrate, a transposer, or a packaging substrate.

Figure 5:
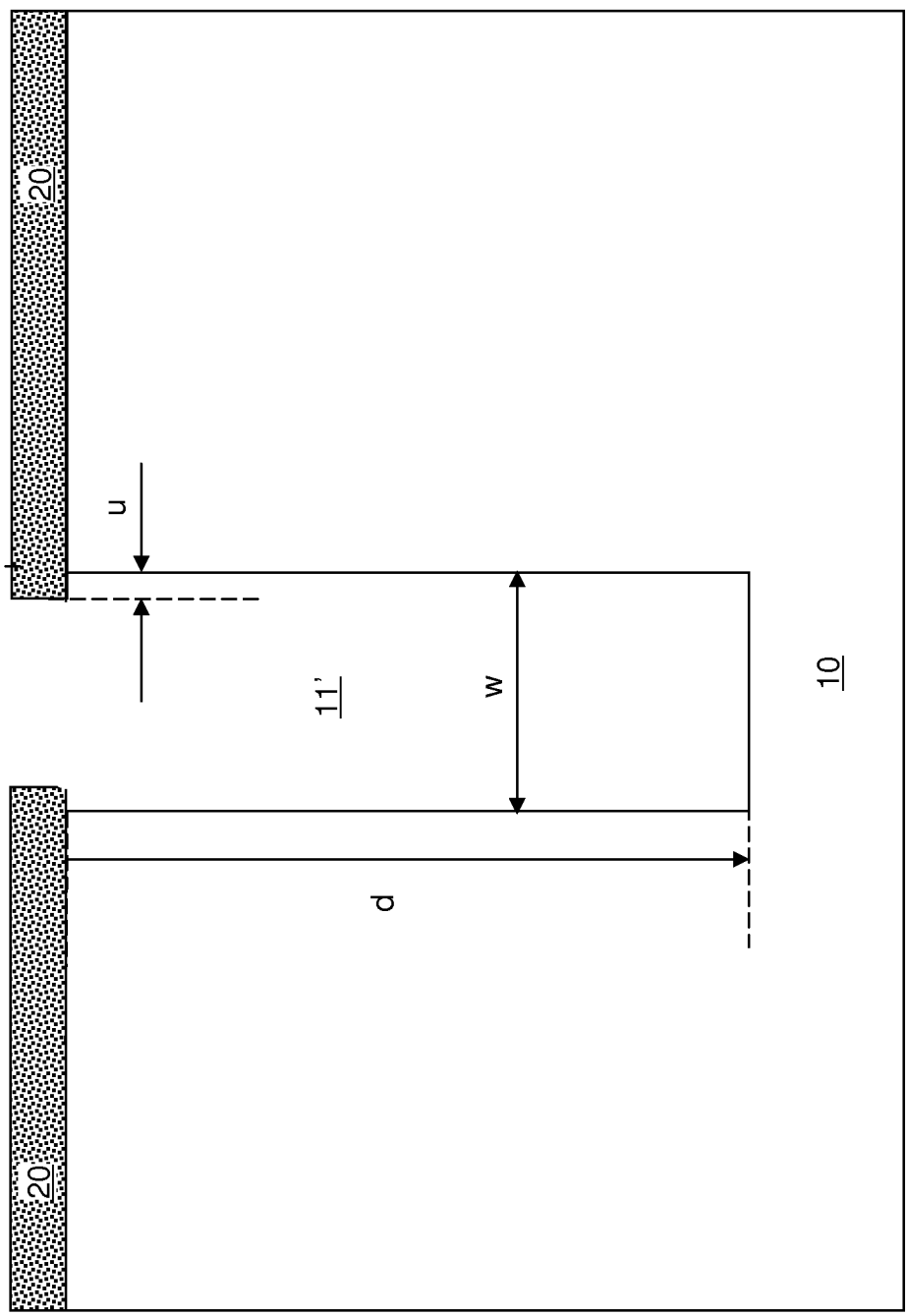
FIG. 5 is a schematic vertical cross-sectional view of a substrate including a deep trench formed by a silicon etch process employing $SF_6$ as an etchant gas or a Bosch process according to an embodiment of the present disclosure.

FIG. 5 is a schematic vertical cross-sectional view of an exemplary substrate including a deep trench formed by a Bosch process at the end of the processing step of FIG. 4G. The scalloping on the sidewalls of the trench 11 is not shown in FIG. 5. Each sidewall of the trench 11 in FIG. 5 represents a vertical surface that approximates the scalloped sidewalls of the trench 11, for example, by a least root mean square deviation approximation method. The bottom surface of the trench 11 in FIG. 5 represents a horizontal surface that represents a physically pitted surface of the trench 11, for example, by a least root mean square deviation approximation method.

The depth d of the trench 11 is defined as the vertical distance between the interface between the semiconductor layer 10 and the mask layer 20. The width w of the trench 11 is defined as the horizontal distance between a pair of vertical sidewalls approximating the physical sidewalls of the trench 11. The undercut u of the trench 11 is defined as a lateral distance between a vertical sidewall of the mask layer 20 and a most proximate portion of the sidewalls of the trench 11. The aspect ratio of the trench is defined as the ratio of the depth d to the width w of the trench 11.

FIGS. 6-11 compare performance of a Bosch process after pretreating sidewalls of an etch process apparatus employing methods of the present disclosure relative to a comparative Bosch process employing the same processing conditions as the Bosch process and performed in an etch process apparatus without any pretreatment.

Figure 6:
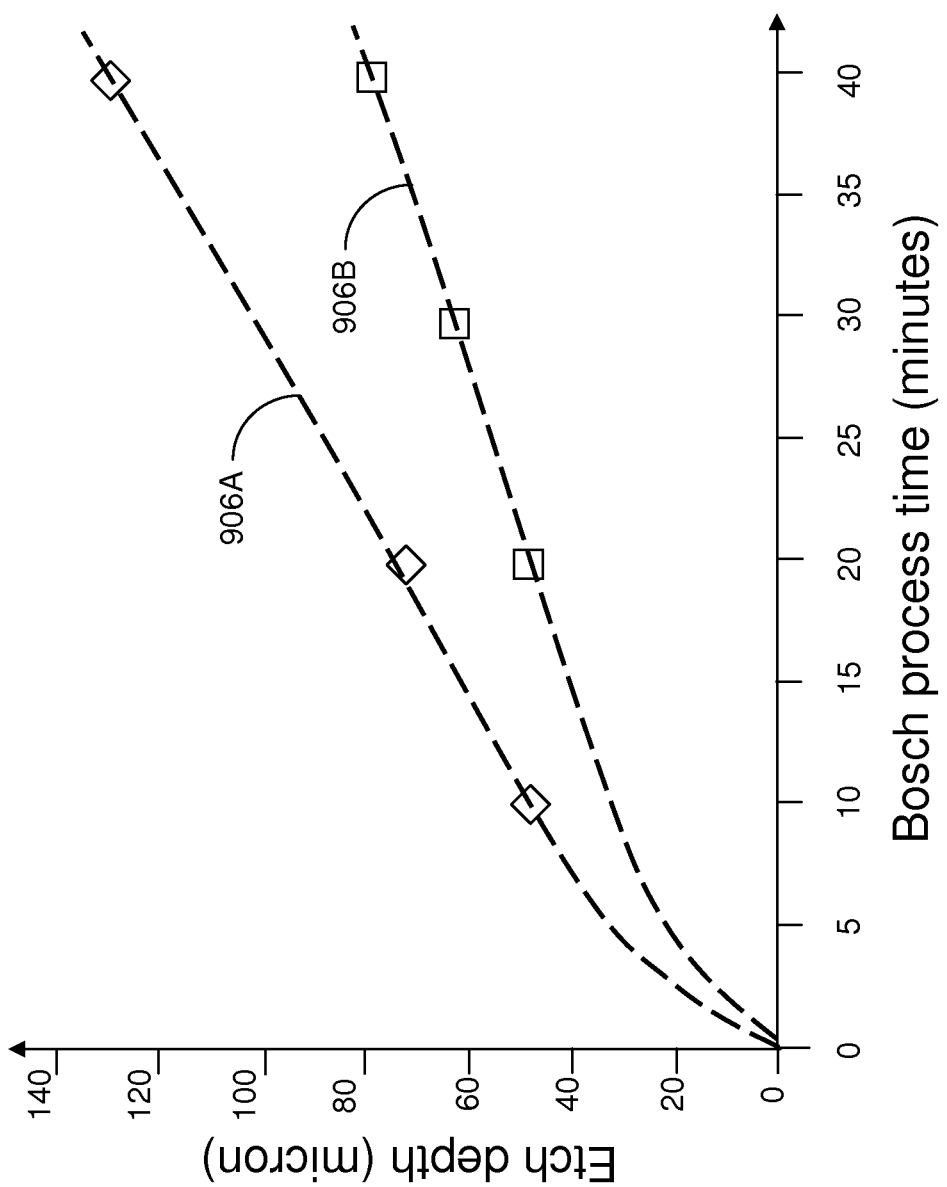
FIG. 6 is a graph comparing performance of a Bosch process in an etch process apparatus preconditioned employing $C_5HF_7$ gas as a hydrofluorocarbon gas and performance of a comparative Bosch process in a comparative exemplary etch process apparatus without any preconditioning.

Referring to FIG. 6, performance of a Bosch process in an etch process apparatus preconditioned employing $C_5HF_7$ gas as a hydrofluorocarbon gas and performance of a comparative Bosch process in a comparative exemplary etch process apparatus without any preconditioning are compared for the etch rate for a 3 micron wide trench. The Bosch process had identical process parameters. The etchant for the Bosch process was $SF_6$, and the passivation gas for the Bosch process was $C_4F_8$. The same etch process apparatus was employed for performing the Bosch process with, and without, pretreatment of the etch process apparatus. The pretreatment process included 5 minutes of deposition step with a plasma generated from $C_5HF_7$ without any accompanying etch step. Thus, the duration of the preconditioning process was 5 minutes.

A first etch depth curve 906A as a function of Bosch process time represents a fit for the etch depth data (represented by diamonds) for the Bosch process in an etch process apparatus preconditioned employing $C_5HF_7$ gas as the hydrofluorocarbon gas. A second etch depth curve 906B as a function of Bosch process time represents a fit for the etch depth data (represented by squares) for the Bosch process in an etch process apparatus without any preconditioning. Comparison of the first and second etch depth curves (906A, 906B) show that preconditioning of the etch process apparatus according to the first embodiment of the present disclosure enhanced the etch rate of a first Bosch process after the chamber preconditioning by at least 50%.

Figure 7:
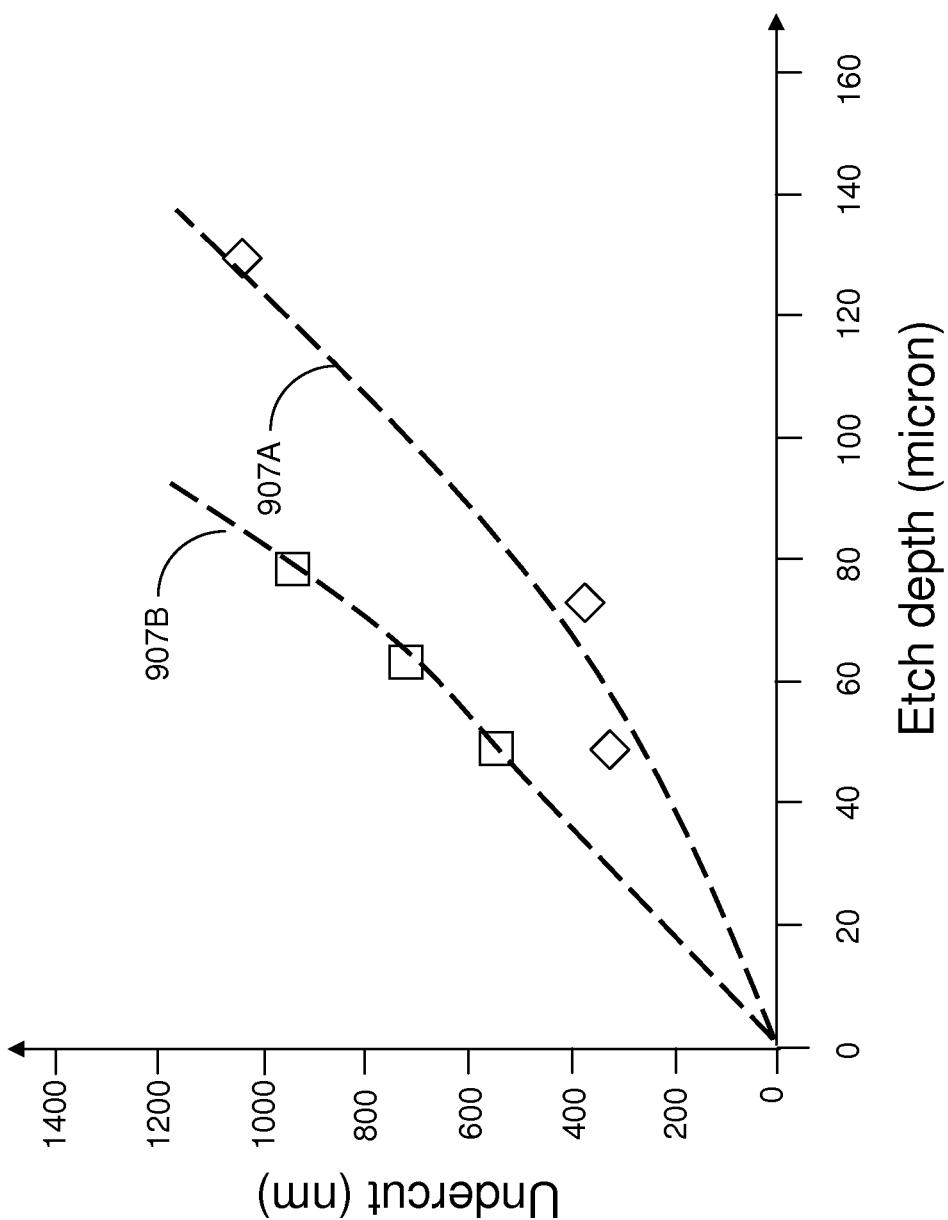
FIG. 7 is another graph comparing performance of a Bosch process in an etch process apparatus preconditioned employing $C_5HF_7$ gas as a hydrofluorocarbon gas and performance of a comparative Bosch process in a comparative exemplary etch process apparatus without any preconditioning.

FIG. 7 compares a different metric between performance a Bosch process in an etch process apparatus preconditioned employing $C_5HF_7$ gas as a hydrofluorocarbon gas and performance of a comparative Bosch process in a comparative exemplary etch process apparatus without any preconditioning. Undercut u, as defined in FIG. 5, was measured for the various 3 micron wide trenches having different depths.

A first undercut curve 907A as a function of etch depth represents a fit for the measured undercut data (represented by diamonds) for the Bosch process in an etch process apparatus preconditioned employing $C_5HF_7$ gas as the hydrofluorocarbon gas. A second undercut curve 907B as a function of etch depth represents a fit for the undercut data (represented by squares) for the Bosch process in an etch process apparatus without any preconditioning. Comparison of the first and second undercut curves (907A, 907B) show that preconditioning of the etch process apparatus according to the first embodiment of the present disclosure reduced the undercut by at least 30% for trenches having comparable depths and widths.

Figure 8:
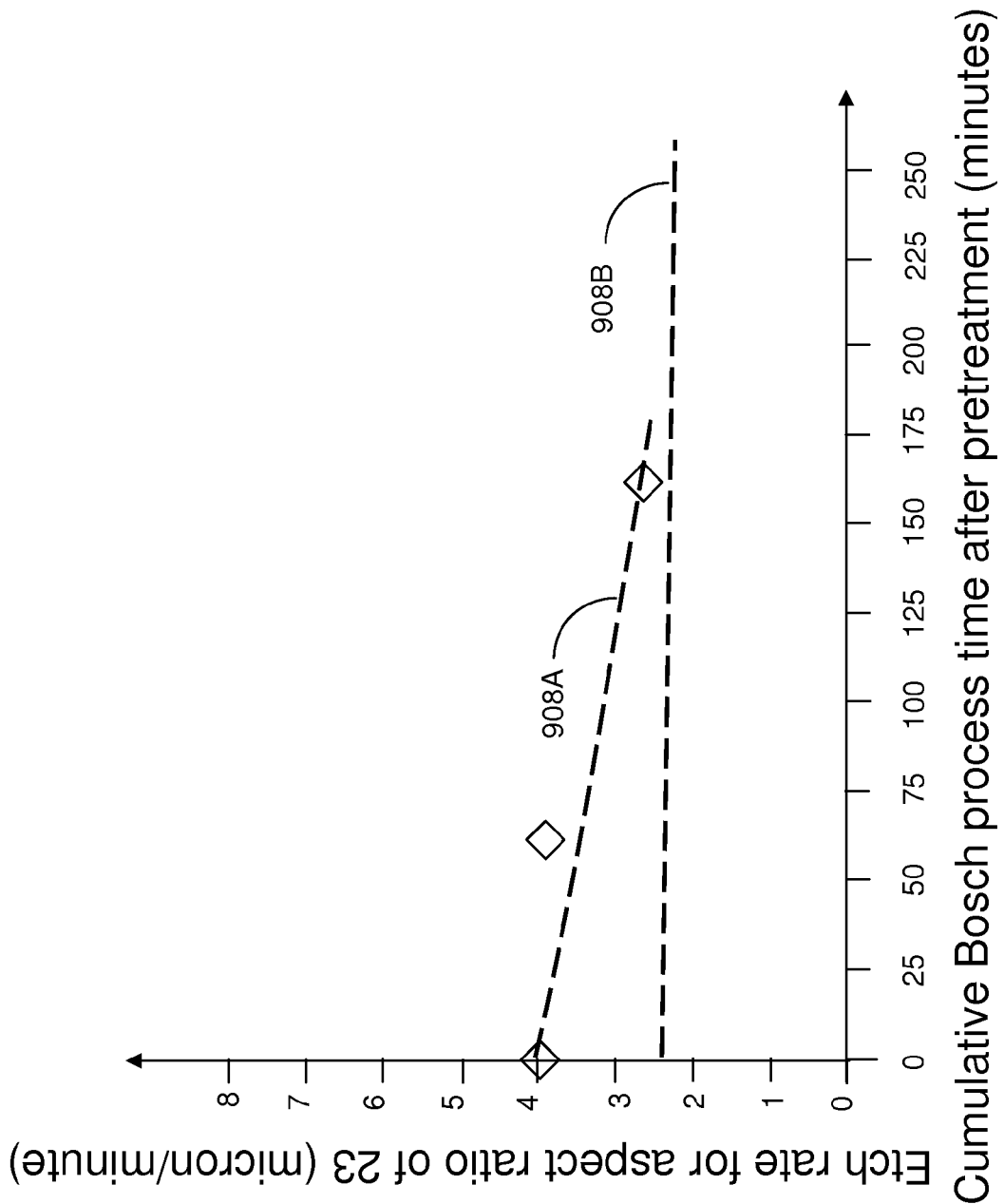
FIG. 8 is a graph illustrating the dependence of the etch rate of a Bosch process in an etch process apparatus preconditioned employing $C_5HF_7$ gas as a hydrofluorocarbon gas on the total cumulative Bosch process time in the etch process apparatus.

Referring to FIG. 8, a graph illustrates the dependence of the etch rate of a Bosch process for trenches having a width of about 3 microns and an aspect ratio of about 23 in an etch process apparatus preconditioned employing $C_5HF_7$ gas as a hydrofluorocarbon gas on the total cumulative Bosch process time in the etch process apparatus.

A first etch rate curve 908A as a function of cumulative Bosch process time represents a fit for the measured etch rate data (represented by diamonds) for the Bosch process in an etch process apparatus preconditioned employing $C_5HF_7$ gas as the hydrofluorocarbon gas. A second etch rate curve 908B as a function of cumulative Bosch process time represents the etch rate for the Bosch process in an etch process apparatus without any preconditioning. Comparison of the first and second etch rate curves (908A, 908B) show that effect of preconditioning of the etch process apparatus according to the first embodiment of the present disclosure decreases with the cumulative Bosch process time after the preconditioning of the etch process apparatus. Repeating the preconditioning process resets the etch rate of a subsequent Bosch process to the maximum value.

Figure 9:
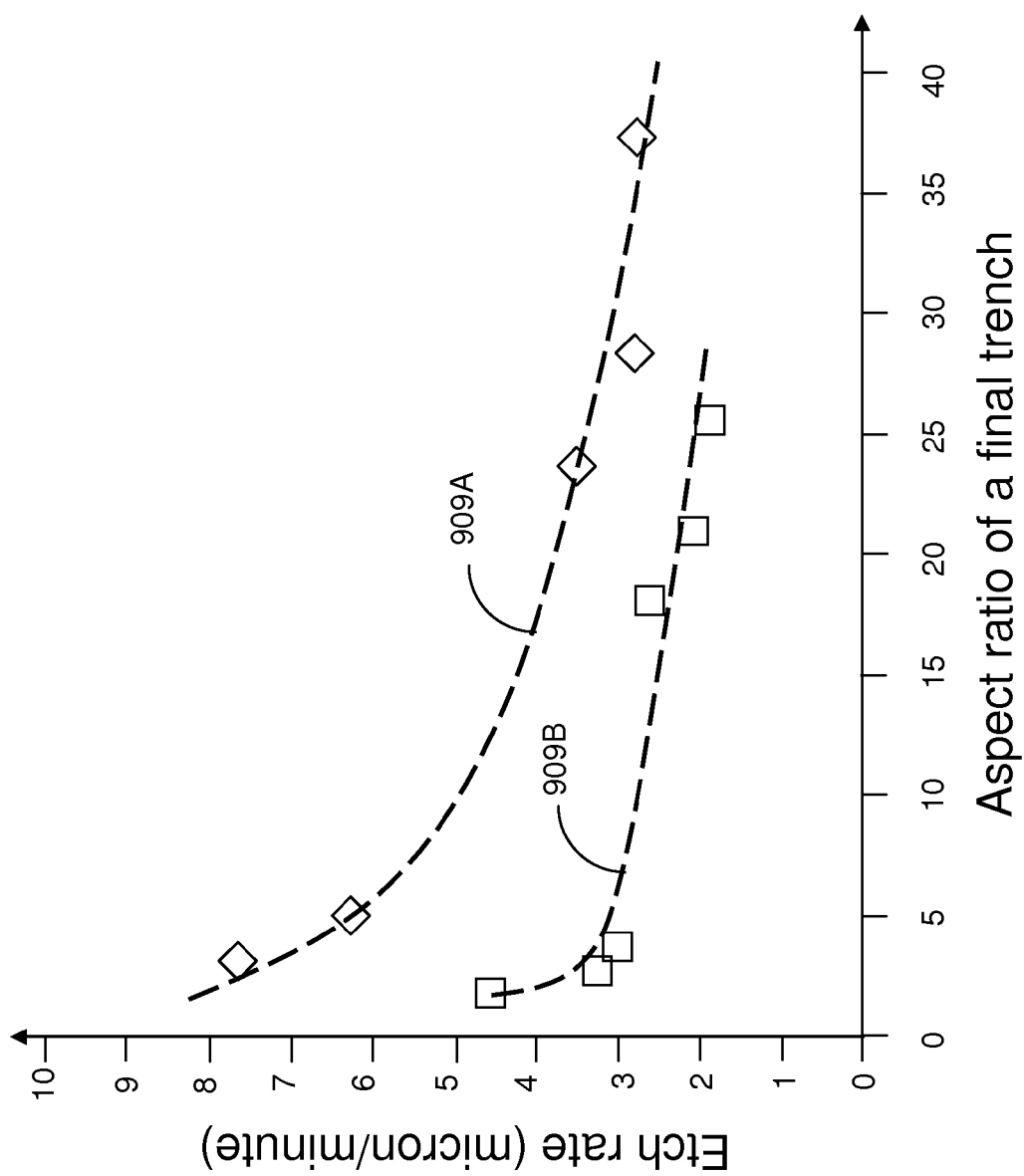
FIG. 9 is a graph comparing performance of a Bosch process in an etch process apparatus preconditioned employing $C_5H_2F_6$ gas as a hydrofluorocarbon gas and $SF_6$ as an etchant gas and performance of a comparative Bosch process in a comparative exemplary etch process apparatus without any preconditioning.

Referring to FIG. 9, performance of a Bosch process in an etch process apparatus preconditioned employing $C_5H_2F_6$ gas as a hydrofluorocarbon gas and $SF_6$ as an etchant gas and performance of a comparative Bosch process in a comparative exemplary etch process apparatus without any preconditioning are compared for the etch rate for a various 3 to 50 micron wide circular trenches having different depths. The Bosch process had identical process parameters. The etchant for the Bosch process was $SF_6$, and the passivation gas for the Bosch process was $C_4F_8$. The same etch process apparatus was employed for performing the Bosch process with, and without, pretreatment of the etch process apparatus. The pretreatment process included multiple cycles of a deposition step employing a plasma generated from $C_5H_2F_6$ and an etch step employing a plasma generated from $SF_6$. The duration of the pretreatment process was about 40 minutes.

A first etch depth curve 909A as a function of Bosch process time represents a fit for the etch depth data (represented by diamonds) for the Bosch process in an etch process apparatus preconditioned employing $C_5H_2F_6$ gas as the hydrofluorocarbon gas and $SF_6$ as an etchant gas. A second etch depth curve 909B as a function of Bosch process time represents a fit for the etch depth data (represented by squares) for the Bosch process in an etch process apparatus without any preconditioning. Comparison of the first and second etch depth curves (909A, 909B) show that preconditioning of the etch process apparatus according to the second embodiment of the present disclosure enhanced the etch rate of a first Bosch process after the chamber preconditioning by at least 50%.

Figure 10:
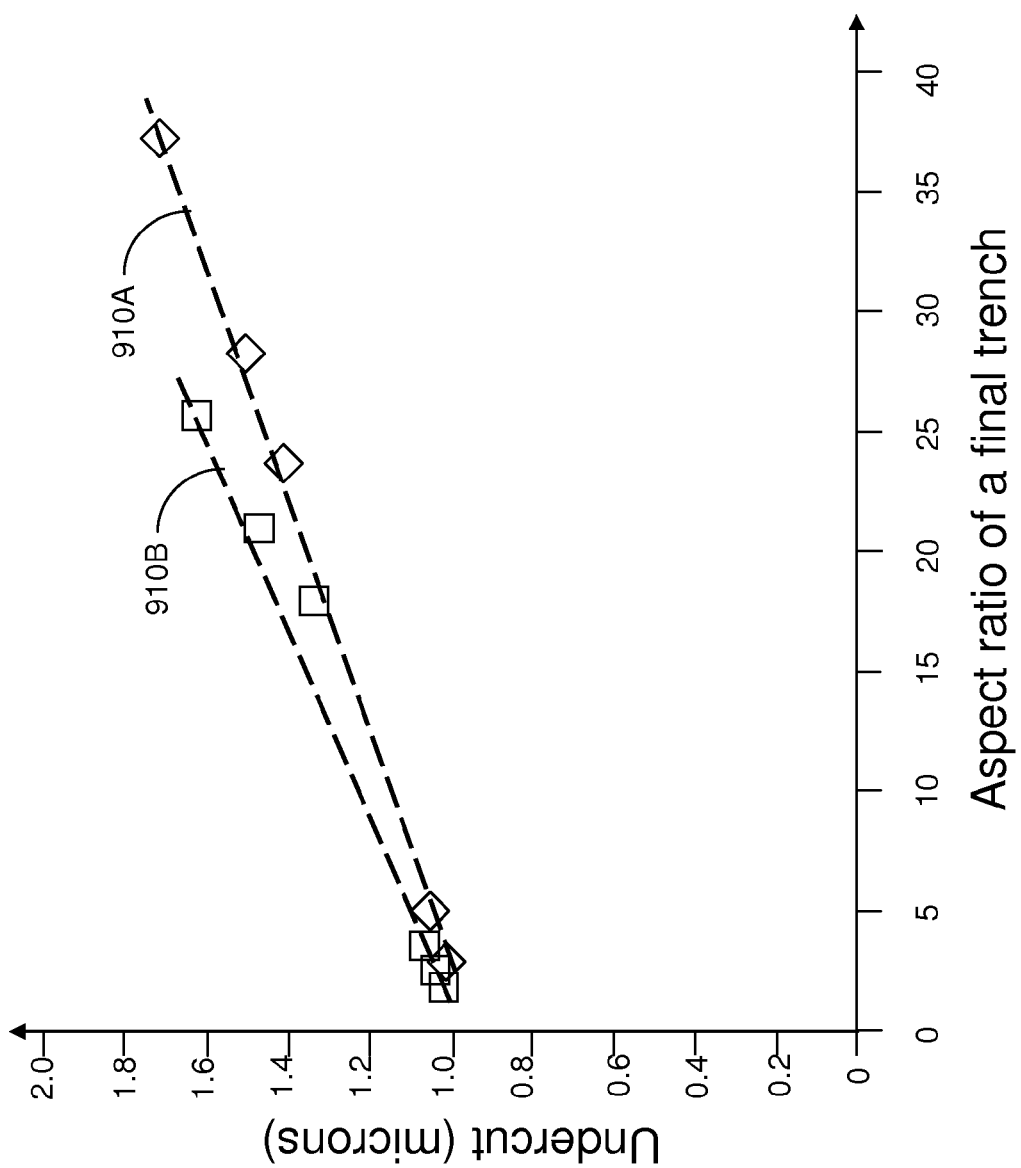
FIG. 10 is another graph comparing performance of a Bosch process in an etch process apparatus preconditioned employing $C_5H_2F_6$ gas as a hydrofluorocarbon gas and $SF_6$ as an etchant gas and performance of a comparative Bosch process in a comparative exemplary etch process apparatus without any preconditioning.

Referring to FIG. 10, undercut u, as defined in FIG. 5, was measured for the various 3 to 50 micron wide circular trenches having different depths for a Bosch process in an etch process apparatus preconditioned employing $C_5H_2F_6$ gas as a hydrofluorocarbon gas and $SF_6$ as an etchant gas and for a comparative Bosch process in a comparative exemplary etch process apparatus without any preconditioning.

A first undercut curve 910A as a function of etch depth represents a fit for the measured undercut data (represented by diamonds) for the Bosch process in an etch process apparatus preconditioned employing $C_5H_2F_6$ gas as the hydrofluorocarbon gas and $SF_6$ as an etchant gas. A second undercut curve 910B as a function of etch depth represents a fit for the undercut data (represented by squares) for the Bosch process in an etch process apparatus without any preconditioning. Comparison of the first and second undercut curves (910A, 910B) show that preconditioning of the etch process apparatus according to the first embodiment of the present disclosure reduced the undercut by at least 10% for trenches having comparable depths and widths.

Figure 11:
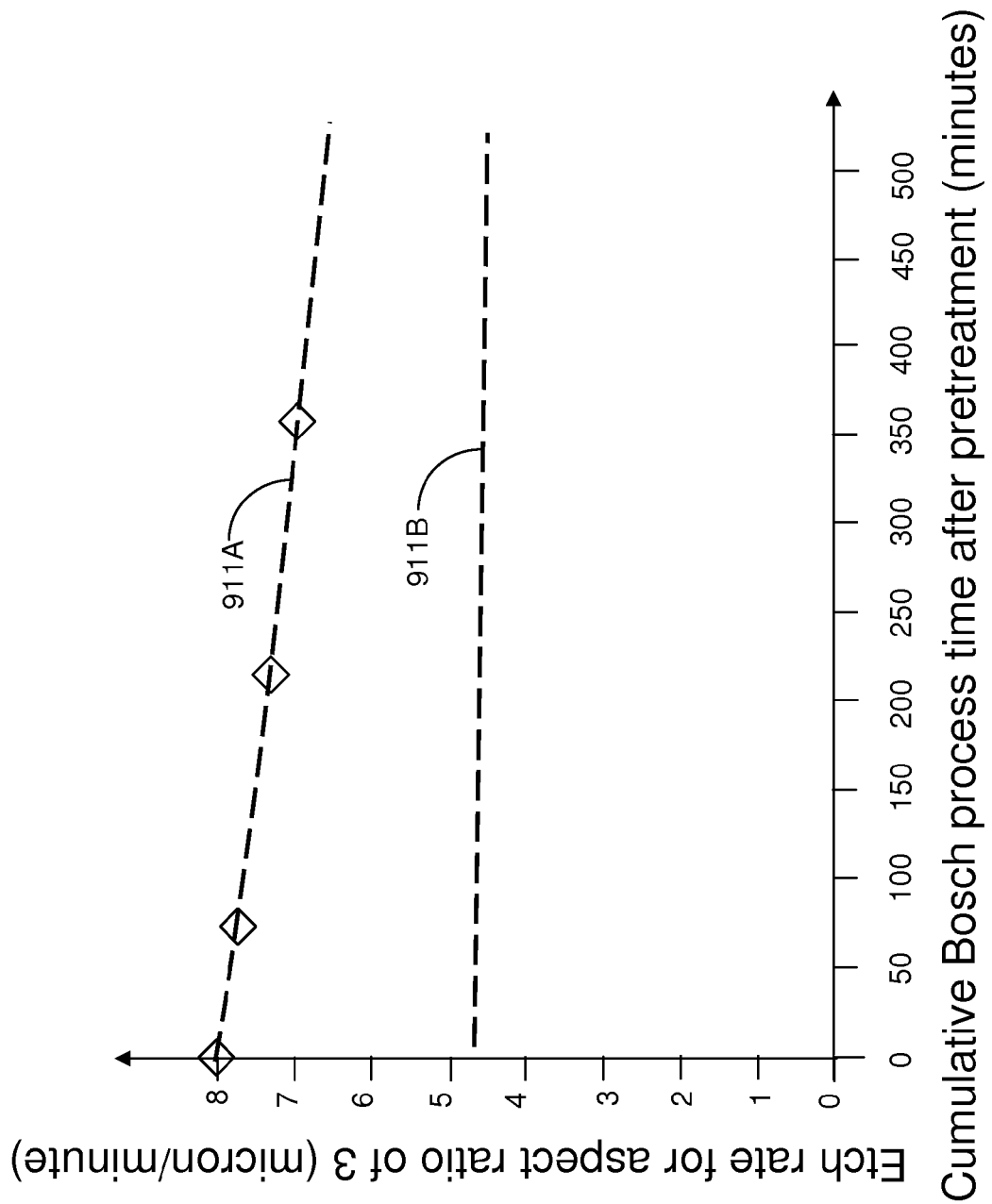
FIG. 11 is a graph illustrating the dependence of the etch rate of a Bosch process in an etch process apparatus preconditioned employing $C_5H_2F_6$ gas as a hydrofluorocarbon gas and $SF_6$ as an etchant gas on the total cumulative Bosch process time in the etch process apparatus.

Referring to FIG. 11, a graph illustrates the dependence of the etch rate of a Bosch process for trenches having a width of about 50 microns and an aspect ratio of about 3 in an etch process apparatus preconditioned employing $C_5H_2F_6$ gas as a hydrofluorocarbon gas and $SF_6$ as an etchant gas on the total cumulative Bosch process time in the etch process apparatus.

An etch rate curve 911 as a function of cumulative Bosch process time represents a fit for the measured etch rate data (represented by diamonds) for the Bosch process in an etch process apparatus preconditioned employing $C_5H_2F_6$ gas as a hydrofluorocarbon gas and $SF_6$ as an etchant gas. The etch rate curve 911A shows that effect of preconditioning of the etch process apparatus according to the second embodiment of the present disclosure decreases with the cumulative Bosch process time after the preconditioning of the etch process apparatus. A second etch rate curve 911B as a function of cumulative Bosch process time represents the etch rate for the Bosch process in an etch process apparatus without any preconditioning. Repeating the preconditioning process resets the etch rate of a subsequent Bosch process to the maximum value.

Figure 12:
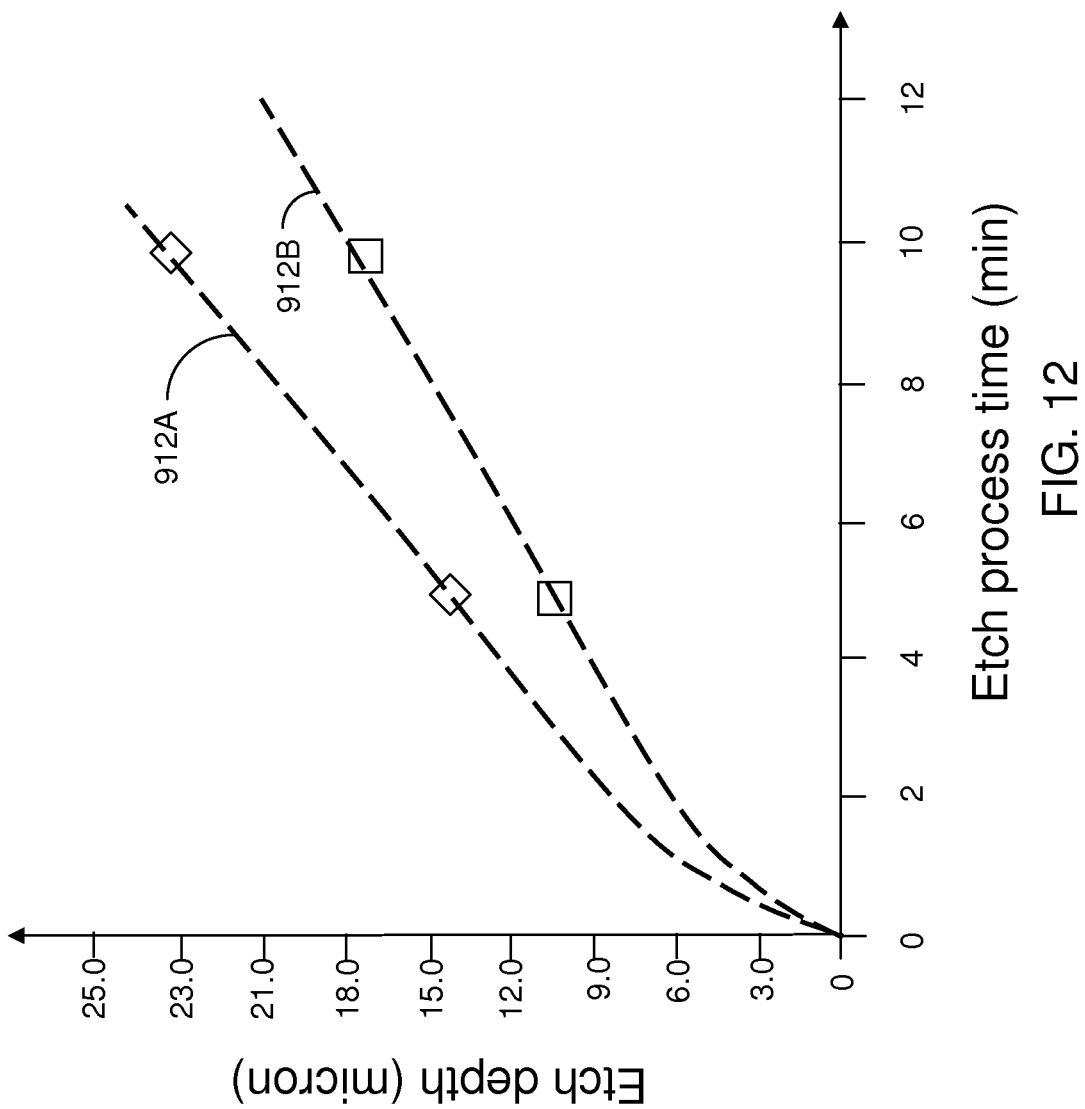
FIG. 12 is a graph comparing performance of a silicon etch process employing $SF_6$ in an etch process apparatus preconditioned employing $C_5H_2F_6$ gas as a hydrofluorocarbon gas and $SF_6$ as an etchant gas, and performance of a comparative silicon etch process in a comparative exemplary etch process apparatus without any preconditioning.

Referring to FIG. 12, performance of a silicon etch process in an etch process apparatus preconditioned employing $C_5H_2F_6$ gas as a hydrofluorocarbon gas and $SF_6$ as an etchant gas and performance of a comparative silicon etch process in a comparative exemplary etch process apparatus without any preconditioning are compared for the etch rate for a 3 micron wide circular trench. The process had identical process parameters. The etchant for the silicon etch process was $SF_6$ without any passivation gas. The same etch process apparatus was employed for performing the silicon etch process with, and without, pretreatment of the etch process apparatus. The pretreatment process included 40 minutes of deposition step with a plasma generated from $C_5H_2F_6$ and etch step with a plasma generated from $SF_6$.

A first etch depth curve 912A as a function of silicon etch process time represents a fit for the etch depth data (represented by diamonds) for the silicon etch process in an etch process apparatus preconditioned employing $C_5H_2F_6$ gas as the hydrofluorocarbon gas and $SF_6$ as an etchant gas. A second etch depth curve 912B as a function of silicon etch process time represents a fit for the etch depth data (represented by squares) for the silicon etch process in an etch process apparatus without any preconditioning. Comparison of the first and second etch depth curves (912A, 912B) show that preconditioning of the etch process apparatus according to the first embodiment of the present disclosure enhanced the etch rate of a first silicon etch process after the chamber preconditioning by at least 50%.

Figure 13:
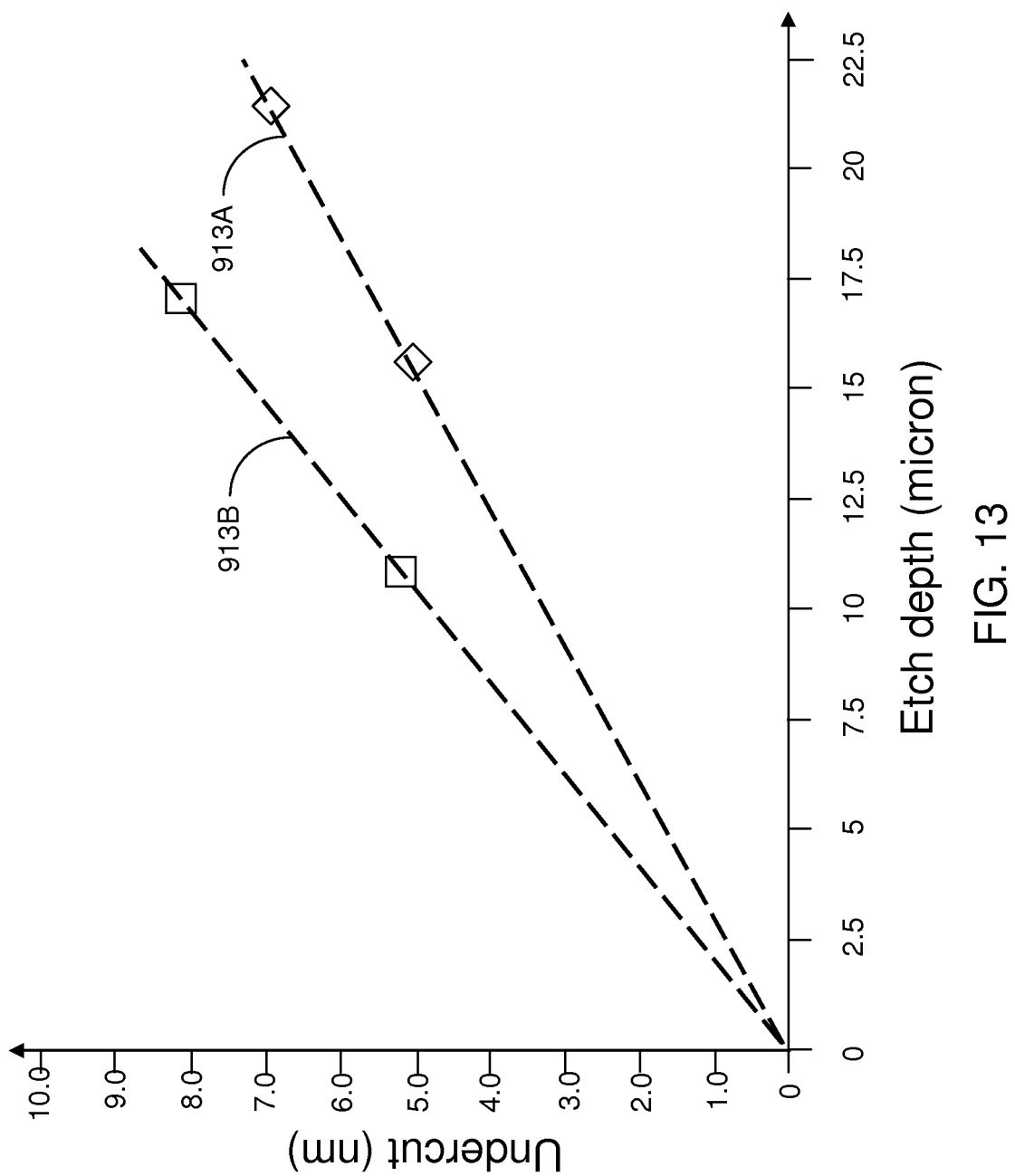
FIG. 13 is an another graph comparing performance of a silicon etch process employing $SF_6$ in an etch process apparatus preconditioned employing $C_5H_2F_6$ gas as a hydrofluorocarbon gas and $SF_6$ as an etchant gas, and performance of a comparative silicon etch process in a comparative exemplary etch process apparatus without any preconditioning.

FIG. 13 compares a different metric between performance a silicon etch process in an etch process apparatus preconditioned employing $C_5H_2F_6$ gas as a hydrofluorocarbon gas and $SF_6$ as an etchant gas, and performance of a comparative silicon etch process in a comparative exemplary etch process apparatus without any preconditioning. Undercut u, as defined in FIG. 5, was measured for the various 3 micron wide circular trenches having different depths.

Figure 14:
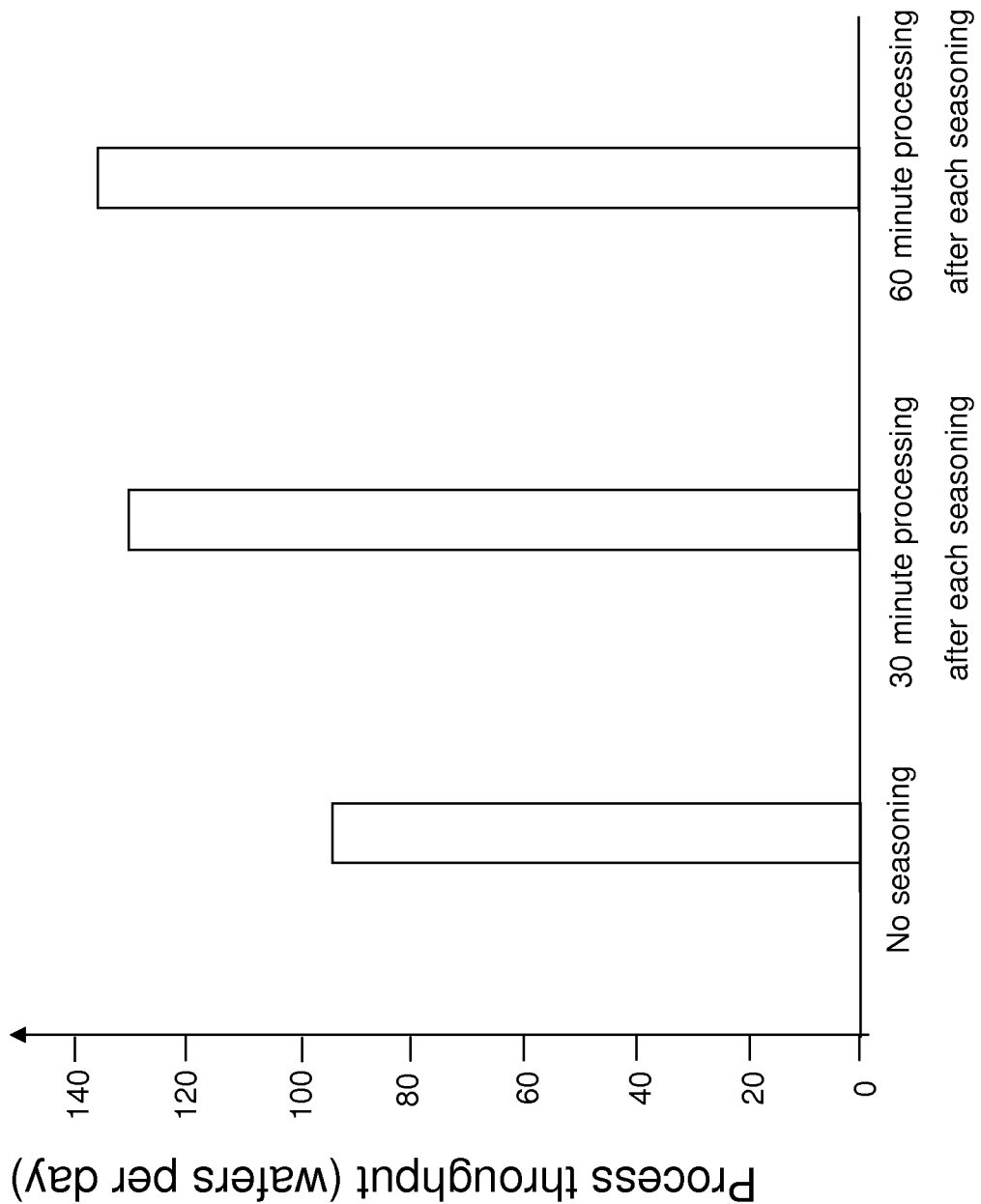
FIG. 14 is a histogram comparing the process throughput of an etch process apparatus under various operating modes.

Referring to FIG. 14, enhancement of process throughput through a pretreatment process is illustrated. If an etch process apparatus is employed for a 15-minute long Bosch process (employing $C_4F_8$ and $SF_6$) without any pretreatment process, the expected throughput of the etch process apparatus is about 96 wafers per day. If a 5 minute pretreatment process (seasoning process) including a single deposition step employing a plasma of $C_5HF_7$ and if the etch process apparatus is subsequently operated for 30 minutes (to process two wafers), the expected throughput of the etch process throughput is about 122 wafers per day. If a 5 minute pretreatment process (seasoning process) including a single deposition step employing a plasma of $C_5HF_7$ and if the etch process apparatus is subsequently operated for 60 minutes (to process four wafers), the expected throughput of the etch process throughput is about 126 wafers per day. Thus, by pretreating the etch process apparatus with a plasma of a hydrofluorocarbon gas to deposit a hydrofluorocarbon polymer material on the inner walls of the etch process apparatus periodically, the overall throughput of the etch process apparatus for a Bosch process can be increased over a comparative method in which the Bosch process is performed continuously without employing a pretreatment process.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of operating an etch process apparatus comprising:
    performing a pretreatment process in an etch process apparatus, said pretreatment process including coating inner walls of said etch process apparatus by depositing a hydrofluorocarbon polymer material generated from a plasma of $C_5H_2F_6$ hydrofluorocarbon gas for a duration of about 40 minutes, and wherein a coating of said hydrofluorocarbon polymer material is formed on said inner walls of said etch process apparatus; and
    performing at least one Silicon etching process in said etch process apparatus on at least one substrate, each of said at least one substrate including a patterned mask layer through which at least one semiconductor material portion is physically exposed, wherein said at least one Silicon etch process employs a plasma of $SF_6$ as an etchant, and wherein said pretreatment process of said inner walls of said etch process apparatus increases an etch rate of said at least one Silicon etching process by at least 50% relative to a comparative Silicon etch process employing a same processing conditions as said at least one Silicon etch process and performed in an etch process apparatus without any pretreatment.

2. The method of claim 1, wherein a dummy substrate is loaded into said etch process apparatus during said pretreatment process, and is subsequently removed prior to performing said at least one Silicon etching process.

3. The method of claim 2, wherein said dummy substrate comprises a mask layer located on a semiconductor layer, said mask layer including a dielectric material selected from doped silicon oxide, undoped silicon oxide, silicon nitride, silicon oxynitride, a dielectric metal oxide, or a combination thereof.

4. The method of claim 1, wherein said percentage monotonically decreases with a total run time of said silicon etch process within said etch process apparatus.

5. The method of claim 1, wherein said hydrofluorocarbon polymer material includes carbon at an atomic concentration in a range from 35% to 100% and fluorine at an atomic concentration from 0% to 65%.

6. The method of claim 1, further comprising repeatedly performing said pretreatment process and said at least one silicon etch process.

7. The method of claim 1, wherein said at least one silicon etch process performed on said at least one substrate is a plurality of silicon etch processes sequentially performed on a plurality of substrates.

8. The method of claim 1, wherein a dummy substrate is loaded into said etch process apparatus during said pretreatment process with said $C_5H_2F_6$ hydrofluorocarbon gas, and said pretreatment process further comprises performing an etch process with etching gas that etches a semiconductor material portion of said dummy substrate.

9. The method of claim 8, further comprising performing a plurality of cycles of said process with said $C_5H_2F_6$ hydrofluorocarbon gas and said etch process during said pretreatment process.

10. The method of claim 1, wherein each of said at least one substrate comprises a mask layer located on a semiconductor layer, said mask layer including a dielectric material selected from doped silicon oxide, undoped silicon oxide, silicon nitride, silicon oxynitride, a dielectric metal oxide, or a combination thereof, and wherein said semiconductor layer comprises silicon or a semiconductor alloy including silicon.

11. A method of operating an etch process apparatus comprising:
    performing a pretreatment process in an etch process apparatus, said pretreatment process including coating inner walls of said etch process apparatus by depositing a hydrofluorocarbon polymer material generated from a plasma of $C_5HF_7$ hydrofluorocarbon gas for a duration of 5 minutes, and wherein a coating of said hydrofluorocarbon polymer material is formed on said inner walls of said etch process apparatus; and
    performing at least one Silicon etching process in said etch process apparatus on at least one substrate, each of said at least one substrate including a patterned mask layer through which at least one semiconductor material portion is physically exposed, wherein said at least one Silicon etch process employs a plasma of $SF_6$ as an etchant, and wherein said pretreatment process of said inner walls of said etch process apparatus increases an etch rate of said at least one Silicon etching process by at least 50% relative to a comparative Silicon etch process employing a same processing conditions as said at least one Silicon etch process and performed in an etch process apparatus without any pretreatment.

12. The method of claim 11, wherein said percentage monotonically decreases with a total run time of said silicon etch process within said etch process apparatus.

13. The method of claim 11, further comprising repeatedly performing said pretreatment process and said at least one silicon etch process.

14. The method of claim 11, wherein said at least one silicon etch process performed on said at least one substrate is a plurality of silicon etch processes sequentially performed on a plurality of substrates.

15. The method of claim 11, wherein a dummy substrate is loaded into said etch process apparatus during said pretreatment process with said $C_5HF_7$ hydrofluorocarbon gas, and said pretreatment process further comprises performing an etch process with etching gas that etches a semiconductor material portion of said dummy substrate.

16. The method of claim 15, further comprising performing a plurality of cycles of said process with said $C_5HF_7$ hydrofluorocarbon gas and said etch process during said pretreatment process.

17. The method of claim 11, wherein each of said at least one substrate comprises a mask layer located on a semiconductor layer, said mask layer including a dielectric material selected from doped silicon oxide, undoped silicon oxide, silicon nitride, silicon oxynitride, a dielectric metal oxide, or a combination thereof, and wherein said semiconductor layer comprises silicon or a semiconductor alloy including silicon.

18. The method of claim 11, wherein a dummy substrate is loaded into said etch process apparatus during said pretreatment process, and is subsequently removed prior to performing said at least one Silicon etching process.

19. The method of claim 18, wherein said dummy substrate comprises a mask layer located on a semiconductor layer, said mask layer including a dielectric material selected from doped silicon oxide, undoped silicon oxide, silicon nitride, silicon oxynitride, a dielectric metal oxide, or a combination thereof.

* * * * *